(12) United States Patent
Hamada et al.

(10) Patent No.: US 10,073,320 B2
(45) Date of Patent: Sep. 11, 2018

(54) WAVELENGTH CONVERTER CONTAINING PHOSPHOR PARTICLES

(71) Applicant: Panasonic Intellectual Property Management Co., Ltd., Osaka (JP)

(72) Inventors: Takahiro Hamada, Osaka (JP); Kazuma Mima, Hyogo (JP); Yukihiko Sugio, Osaka (JP); Yoshihisa Nagasaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 75 days.

(21) Appl. No.: 15/203,614

(22) Filed: Jul. 6, 2016

(65) Prior Publication Data

US 2017/0023199 A1    Jan. 26, 2017

(30) Foreign Application Priority Data

Jul. 23, 2015    (JP) ................ 2015-145496

(51) Int. Cl.
| | | |
|---|---|---|
| *G02F 1/355* | (2006.01) | |
| *G02F 1/361* | (2006.01) | |
| *H01L 33/50* | (2010.01) | |
| *F21K 9/64* | (2016.01) | |
| *F21S 41/14* | (2018.01) | |
| *F21S 41/20* | (2018.01) | |

(52) U.S. Cl.
CPC .............. *G02F 1/3551* (2013.01); *F21K 9/64* (2016.08); *F21S 41/14* (2018.01); *F21S 41/285* (2018.01); *G02F 1/3619* (2013.01); *H01L 33/501* (2013.01); *H01L 2933/0041* (2013.01); *H01L 2933/0075* (2013.01)

(58) Field of Classification Search
CPC ...... G02F 1/355; G02F 1/3551; G02F 1/3619; F21K 9/56; H01L 33/50; H01L 33/502; C09K 11/08
See application file for complete search history.

(56) References Cited

U.S. PATENT DOCUMENTS

| | | | | |
|---|---|---|---|---|
| 4,959,262 A * | 9/1990 | Charles | ................. | H01C 7/112 |
| | | | | 156/89.17 |
| 8,723,198 B2 * | 5/2014 | Brunner | ............. | C09K 11/7701 |
| | | | | 257/98 |
| 8,780,438 B2 * | 7/2014 | Hamada | .............. | H01S 5/02296 |
| | | | | 257/98 |

(Continued)

FOREIGN PATENT DOCUMENTS

| | | |
|---|---|---|
| JP | 2015-008278 | 1/2015 |
| WO | 2013/172025 | 11/2013 |
| WO | 2013/175773 | 11/2013 |

OTHER PUBLICATIONS

Arthur H. Reading et al., "High efficiency white LEDs with single-crystal ZnO current spreading layers deposited by aqueous solution epitaxy", 2011 OSA, vol. 20, No. S1, Optics Express.

(Continued)

*Primary Examiner* — Daniel Petkovsek
(74) *Attorney, Agent, or Firm* — McDermott Will & Emery LLP

(57) ABSTRACT

A wavelength converter comprises: phosphor particles; and a matrix that is located between the phosphor particles and comprises zinc oxide crystallites. Pores are included in at least one of the zinc oxide crystallites.

12 Claims, 21 Drawing Sheets

(56) References Cited

U.S. PATENT DOCUMENTS

| | | | |
|---|---|---|---|
| 8,854,725 B2* | 10/2014 | Hamada | F21K 9/64 |
| | | | 359/326 |
| 2014/0071683 A1 | 3/2014 | Hamada et al. | |
| 2014/0072812 A1 | 3/2014 | Hamada et al. | |
| 2014/0353702 A1 | 12/2014 | Nagao et al. | |
| 2015/0291880 A1* | 10/2015 | Okuyama | H01L 33/502 |
| | | | 359/630 |

OTHER PUBLICATIONS

Jacob J. Richardson et al., "Thermally Induced Pore Formation in Epitaxial ZnO Films Grown from Low Temperature Aqueous Solution", Crystal Growth & Design 2011, 11, pp. 3558-3563.

* cited by examiner

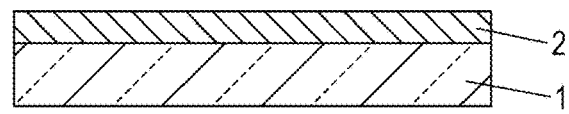
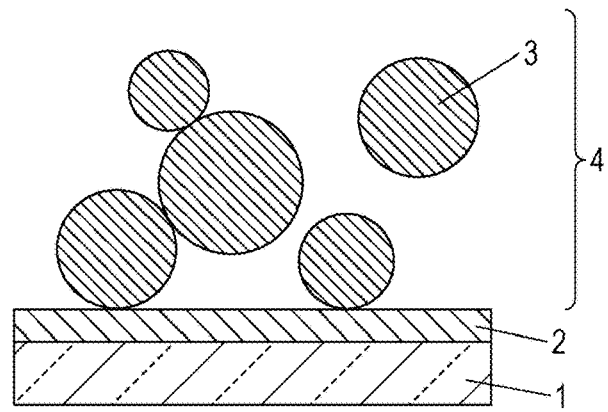
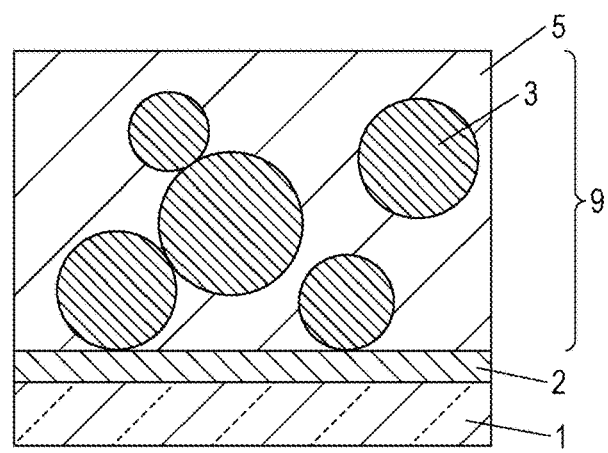
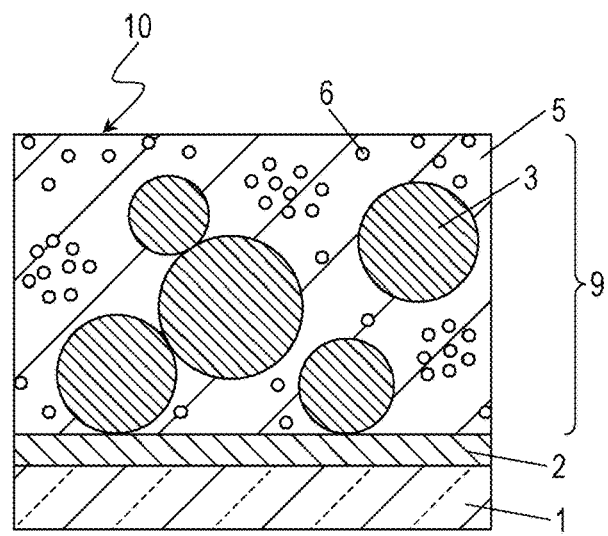

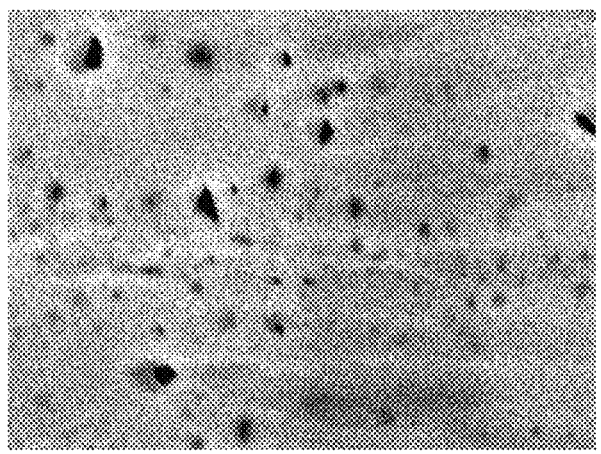
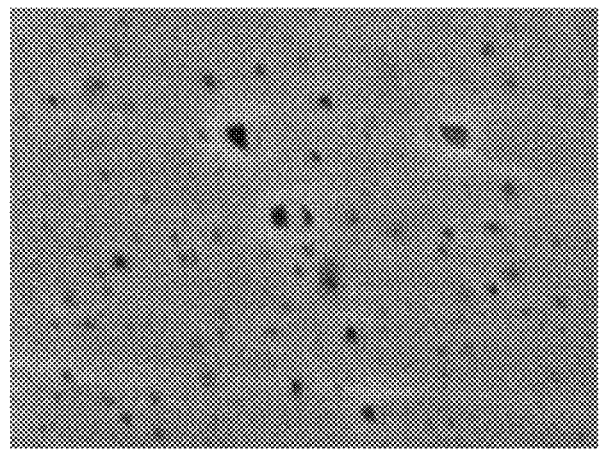
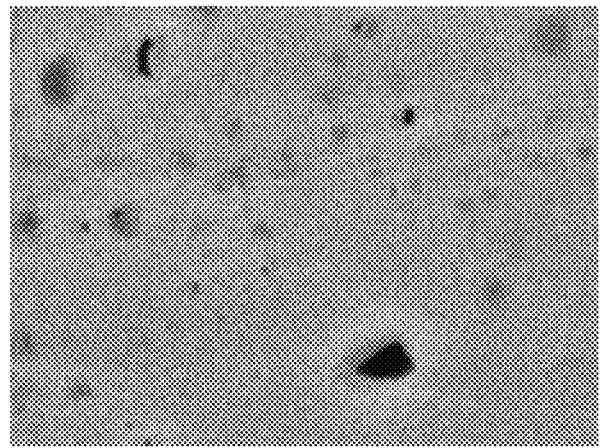

600 nm 600 nm

WAVELENGTH CONVERTER CONTAINING PHOSPHOR PARTICLES

BACKGROUND

1. Technical Field

The present disclosure relates to a wavelength converter, a light source including a semiconductor light emitting device (e.g., laser diode) and a wavelength converter converting the wavelength of emission light from the semiconductor light emitting device, and a lighting system (e.g., lighting system for a vehicle) including the light source. The present disclosure also relates to a vehicle including the lighting system for a vehicle.

2. Description of the Related Art

Light sources including a combination of a semiconductor light emitting device and a phosphor have been developed. The light sources are used in, for example, a variety of lighting systems. In particular, high-output light sources are useful for lighting systems, such as a lighting system for a vehicle (e.g., head lamp), and high-output light sources are being developed.

For example, International Publication No. WO2013/172025 discloses a wavelength converter including phosphor particles and a matrix made of zinc oxide located between the phosphor particles, wherein the zinc oxide located between the phosphor particles is formed by a solution growth method at a low temperature, and discloses a light source, such as a light emitting diode (LED) element or a semiconductor laser light emitting device, which excites the wavelength converter with a semiconductor light emitting device, such as an LED or a semiconductor laser.

SUMMARY

One non-limiting and exemplary embodiment provides a technology for increasing the energy density of light emitted from a wavelength converter.

In one general aspect, the techniques disclosed here feature a wavelength converter including phosphor particles and a matrix that is located between the phosphor particles and includes zinc oxide crystallites. Pores are included in at least one of the zinc oxide crystallites.

The wavelength converter according to the present disclosure can emit light having an increased energy density.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIGS. 2A to 2D are cross-sectional views showing the order of steps of a method for producing a wavelength converter according to the first embodiment of the present disclosure;

FIGS. 17A to 17C are cross-sectional SEM observation images of pore collecting parts of the wavelength converter of Example 1;

DETAILED DESCRIPTION

Figure 1:
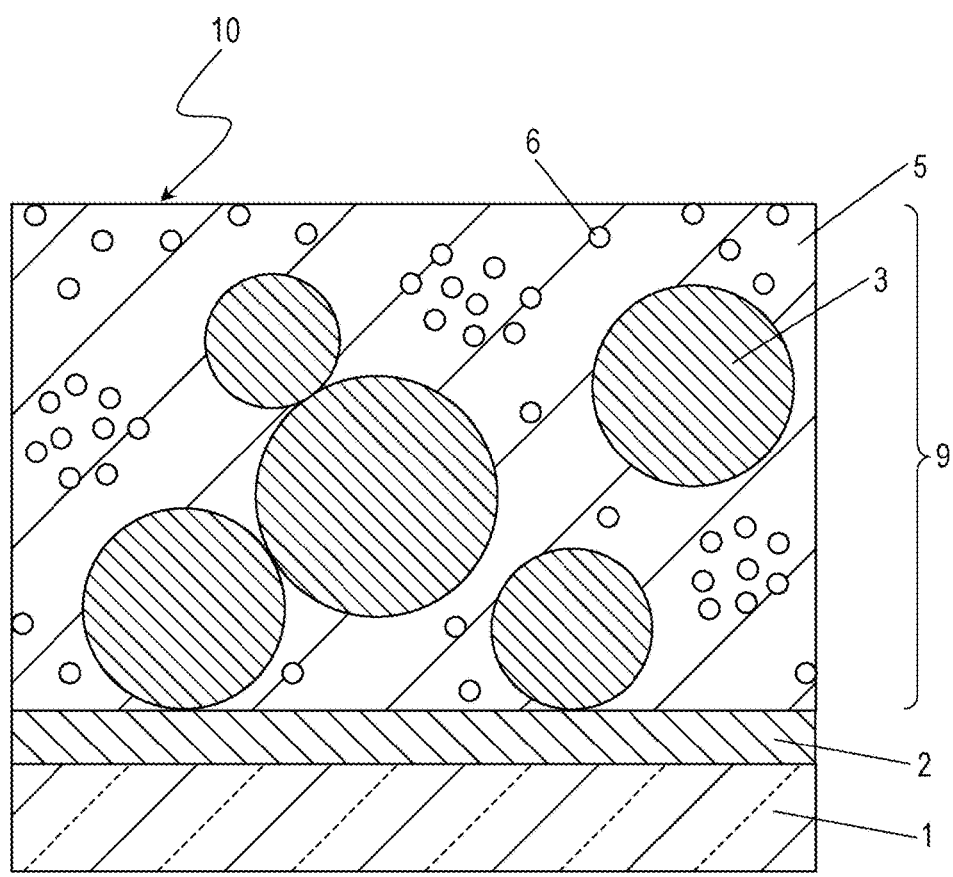
FIG. 1 is a cross-sectional view of a wavelength converter according to a first embodiment of the present disclosure.

The present disclosure will now be described in detail by specific embodiments. It is understandable that the present disclosure is not limited to these embodiments and can be appropriately modified within the technical scope of the present disclosure.

The problems that have been found by the present inventors will now be described in detail.

The energy density of light emitted by a laser diode (LD) is higher than that of light emitted by a known light emitting diode (LED) used as a semiconductor light emitting device. The temperature of a phosphor layer increases when excited with light having a high energy density. A phosphor has a temperature-dependent luminous efficiency, and the luminous efficiency decreases with an increase in the temperature of the phosphor.

That is, excitation of a phosphor layer by light having a high energy density increases the temperature of the phosphor layer and as a result decreases decrease the luminous efficiency of the phosphor. It is therefore necessary to reduce the temperature of the phosphor by performing efficient heat conduction of the generated heat to the outside. In a wavelength converter including phosphor particles and zinc oxide located as a matrix between the phosphor particles, impurities are introduced into a zinc oxide crystal during the formation thereof. The impurities scatter and prevent heat conduction, leading to a considerable problem of an increase in temperature of the phosphor layer, which reduces the luminous efficiency.

Furthermore, in a wavelength converter including a phosphor layer and a substrate, the heat generated in the phosphor layer can be transferred to the substrate side. If the thickness of the substrate is larger than that of the phosphor layer, heat moves to the substrate side having a relatively larger heat capacity. If the heat of the substrate is released with, for example, an air-cooling cooler, the heat generated in the phosphor layer further efficiently moves from the phosphor layer to the substrate side. When the heat thus moves from the phosphor layer to the substrate, the distance that the heat moves is longer in a thick phosphor layer than in a thin phosphor layer. Thus, the thermal resistance increases with the thickness of the phosphor layer, leading to a problem of an increase in the temperature of the phosphor. However, if the thickness of the phosphor layer is decreased using the same phosphor particles for reducing the temperature of the phosphor layer, the phosphor cannot sufficiently convert the wavelength of excitation light, and desired emission properties cannot be obtained. The above demonstrates that there is incompatibility between a reduction in the thickness of a phosphor layer for decreasing the temperature of the phosphor layer and acquisition of desired emission properties.

In view of these problems, the present inventors arrived at a novel wavelength converter, a method for producing the wavelength converter, and a light source including the wavelength converter.

The wavelength converter according to an aspect of the present disclosure includes a matrix that is located between phosphor particles and includes zinc oxide crystallites each including pores therein.

The present disclosure provides a wavelength converter including:

phosphor particles; and a matrix that is located between the phosphor particles and includes zinc oxide crystallites. Pores are included in at least one of the zinc oxide crystallites.

The present disclosure can provide a wavelength converter emitting light having a high energy density.

The zinc oxide crystallites may be columnar crystals.

At least one of the pores may have a diameter of 10 nm or more and 200 nm or less.

A cross section of the at least one of the zinc oxide crystallites includes first regions having pore ratios higher than remaining regions, where a pore ratio of a region is a ratio of an area occupied by pores to a whole area of the region.

The pores in at least one of the zinc oxide crystallites may be disposed non-uniformly.

A pore ratio of at least one of the first regions is equal to or more than 2% and equal to or less than 6%.

The wavelength converter may further include a substrate, and the phosphor particles and the matrix may constitute a phosphor layer such that the thickness of the substrate is larger than a thickness of the phosphor layer. The zinc oxide crystallites may be oriented in a c-axis.

The present disclosure also provides a light source including a semiconductor light emitting device and the wavelength converter. The semiconductor light emitting device emits light having a peak wavelength of 420 nm or more and 470 nm or less. The wavelength converter receives the light emitted from the semiconductor light emitting device and emits converted light having a wavelength different from a wavelength of the light.

The emission light from the semiconductor light emitting device may have an energy density of at least 11.4 W/mm$^2$.

The present disclosure also provides a lighting system including the light source and a power supply source coupled to the light source.

The lighting system may be a lighting system for a vehicle.

The present disclosure also provides a vehicle including the lighting system and a generator coupled to the power supply source.

The present disclosure also provides a method for producing a wavelength converter, the method including:

forming a phosphor particle layer including phosphor particles on a zinc oxide film;

forming a matrix including zinc oxide in the spaces between the phosphor particles by a solution growth method to form a phosphor layer; and heating the phosphor layer.

The method for producing a wavelength converter of the present disclosure can efficiently produce a wavelength converter of the present disclosure.

The heating temperature may be 450° C. or more and 1000° C. or less.

Embodiments of the present disclosure will now be described with reference to the drawings.

First Embodiment

FIG. 1 is a cross-sectional view of a wavelength converter according to a first embodiment. The wavelength converter 10 according to the embodiment includes a phosphor layer 9 including phosphor particles 3, a zinc oxide matrix 5 located between the phosphor particles 3, and pores 6 located inside and on the surface of the zinc oxide matrix 5. The wavelength converter 10 converts at least part of incident light to light having a wavelength band different from that of the incident light and emits the light. Specifically, for example, the wavelength converter 10 emits light having a wavelength longer than that of the incident light.

The substrate 1 is made of one selected from the group consisting of sapphire, gallium nitride, aluminum nitride, silicon, aluminum, glass, quartz, silicon carbide, and zinc oxide. In the present disclosure, the term "substrate" refers to not only a so-called substrate, such as a sapphire substrate or a silicon substrate, but also, for example, a thin film formed on a surface of a substrate. The thin film formed on a substrate can be selected from, for example, an antireflection film for preventing reflection of excitation light, a dichromic mirror formed of a dielectric multilayer film, a reflection film of a metal, a reflection enhancing film such as a dielectric multilayer film, and protective films formed of such thin films. The thickness of the substrate 1 is desirably larger than that of the phosphor layer 9.

The zinc oxide thin film 2 is formed of monocrystalline zinc oxide or polycrystalline zinc oxide. The thin film 2 functions as a seed crystal that becomes a nucleus of crystal growth of zinc oxide constituting the matrix 5. If the surface of a substrate or the surface of a thin film formed on a substrate functions as a seed crystal for forming the matrix 5 and can directly form zinc oxide (for example, when using a gallium nitride substrate or a zinc oxide substrate), the zinc oxide matrix 5 can be formed without forming the zinc oxide thin film 2.

The phosphor particles 3 may have any excitation wavelength, emission light wavelength, and particle diameter that are generally used in light emitting devices. For example, YAG (yttrium/aluminum/garnet) or β-SiAlON (Sialon) can be used. In particular, the wavelength of light exciting the phosphor and the wavelength of light to be emitted can be appropriately selected depending on the use of the wavelength converter 10. The doping element for YAG or β-SiAlON can also be selected depending on these wavelengths.

The zinc oxide constituting the matrix 5 has a Wurtzite crystal structure. In zinc oxide oriented in the c-axis, the plane parallel to the substrate is the c-plane. Zinc oxide crystal grown in the c-axis orientation comprises columnar crystals, and the amount of the crystal grain boundaries in the c-axis direction is low. The columnar crystals of zinc oxide of the matrix 5 are grown in the c-axis direction from the thin film 2 of zinc oxide oriented in the c-axis formed on the substrate. Therefore, the columnar crystals have a small number of crystal grain boundaries. Consequently, in the phosphor layer 9, scatter caused by crystal grain boundaries can be decreased. (The scatter prevents movement of heat.) The columnar crystal in the c-axis orientation means that the growth of zinc oxide in the c-axis direction is faster than the growth in the a-axis direction and a crystallite of zinc oxide vertically long is formed on the substrate. That is, the crystallite length in the direction perpendicular to the substrate is longer than that in the horizontal direction. The term "crystallite" refers to the smallest region that can be regarded as a monocrystal among polycrystals. A columnar crystal is a crystallite having a column shape.

A monocrystalline zinc oxide matrix 5 epitaxially grown from the thin film 2 can be formed in the spaces inside the phosphor layer 9 (i.e., phosphor layer 9 made of a plurality of phosphor particles before the formation of the zinc oxide matrix 5) by using a thin film of monocrystalline zinc oxide epitaxially grown as the thin film 2 of zinc oxide. In the epitaxially grown monocrystalline zinc oxide, the amount of crystal grain boundaries is very low to prevent scatter caused by the crystal grain boundaries. That is, in the phosphor layer 9, scatter that prevents heat from moving does not substantially occur. The term "epitaxially grown monocrystalline zinc oxide" means that the crystal directions of the crystallites constituting the zinc oxide are the same as one another.

The process of forming the zinc oxide matrix 5 in the spaces inside the phosphor layer 9 can employ a solution growth method. The solution growth method uses an aqueous solution containing Zn ions as a raw material solution and can grow zinc oxide using the zinc oxide thin film 2 as a seed crystal becoming a nucleus of crystal growth of zinc oxide. The raw material solution is a dilute aqueous solution and therefore has a low viscosity. Accordingly, the raw material solution can readily arrive at the spaces inside the phosphor layer 9. Furthermore, the crystal growth reaction of zinc oxide can be performed in a state that a substrate 1 provided with the phosphor layer 9 formed of phosphor particles 3 (i.e., the phosphor layer 9 before the formation of the zinc oxide matrix 5) is immersed in the raw material solution, and the raw material for growing zinc oxide is Zn ions. Accordingly, even if Zn ions are consumed by crystal growth of zinc oxide, Zn ions readily disperse from the raw material solution outside the phosphor layer 9 up to the inside of the phosphor layer 9 and arrive at the inside of the phosphor layer 9. Consequently, occurrence of voids inside the phosphor layer 9 due to a shortage of raw materials can be prevented. Herein, the voids in the present disclosure are holes naturally formed when a zinc oxide matrix is formed in the spaces inside the phosphor layer 9 because not all the spaces are filled with zinc oxide, as shown in International Publication No. WO2013/172025. The voids are readily formed in an upper portion of the phosphor particle or a gap between the phosphor particles. The voids are generated between the columnar crystals of zinc oxide, but are not generated inside the columnar crystal. The sizes of the voids vary depending on the particle diameters of the phosphor particles used. When an arithmetic average of the particle diameters of the phosphor particles is 9 μm, the lengths of the voids are typically about 0.6 to 1.7 Many of the voids have shapes other than a sphere.

The post-treatment process for forming pores can be heat treatment. Pores 6 can be formed inside the crystallite of the zinc oxide columnar crystal by forming a zinc oxide matrix 5 in the spaces inside the phosphor layer 9 and then heating the zinc oxide matrix 5. The pores 6 are smaller than the voids and typically have a diameter of about 10 to 200 nm. The matrix 5 may include a plurality of pore collecting parts (corresponding to first regions of the present disclosure) where a plurality of pores gather. In other words, a cross section of the zinc oxide columnar crystal may include a plurality of pore collecting parts having pore ratios higher than remaining regions. A pore ratio of a region is a ratio of an area occupied by pores to a whole area of the region. The matrix 5 may have at least one pore collecting part where the pore ratio is 2% or more and 6% or less, in the plurality of pore collecting parts. The concentration of impurities contained in the zinc oxide matrix 5 having the pores 6 is lower than that in a zinc oxide matrix not containing pores. The present inventors presume that the reason for this is that the impurities in a zinc oxide crystal are removed during the formation of the pores. Throughout the specification, the diameter of a pore is defined as the diameter of a circle circumscribed to the pore in a cross-sectional SEM observation image of a phosphor layer; the area of one pore is defined as the area of the circle circumscribed to the pore; and the area of the pores in a pore collecting part is defined as the sum of the areas of the pores in the pore collecting part.

In the zinc oxide matrix 5 having the pores 6, since impurities contained in the zinc oxide crystal are removed during the formation of the zinc oxide matrix 5, the heat conducted between crystal lattices is prevented from scattering. In addition, since each of the pores 6 contains air therein, the difference (0.95) in index of refraction between the air (1.0) inside the pore 6 and zinc oxide (1.95) is large. Thus, the zinc oxide matrix 5 including a plurality of pores can increase the degree of light scattering of the phosphor layer 9. Accordingly, the thickness of the phosphor layer 9 for a wavelength converter having a desired color temperature can be reduced without modifying the phosphor particles 3.

The wavelength converter of the embodiment includes a zinc oxide matrix 5 having pores 6 formed between the phosphor particles 3 and thereby has high heat conductivity and high light scatterability. Accordingly, the temperature of the wavelength converter excited with light having a high energy density is decreased to achieve a high luminous efficiency.

A method for producing a wavelength converter 10 according to the embodiment will now be described with reference to the drawings.

FIGS. 2A to 2D are cross-sectional views showing the order of steps of the method according to the first embodiment.

In the first embodiment, a crystal of a zinc oxide matrix 5 grows from the thin film 2 of zinc oxide through the spaces inside the phosphor particle layer 4 formed of phosphor particles 3. After the formation of the matrix 5, pores 6 are formed inside and on the surface of the matrix 5.

First, as shown in FIG. 2A, a thin film 2 of zinc oxide is formed on a substrate 1. When the lattice mismatching rate between the crystal structure of the substrate 1 and that of the zinc oxide is low, a thin film 2 of monocrystalline zinc oxide can be formed. When the substrate 1 is made of an amorphous material not having any crystal structure, such as glass, or when the substrate 1 is a monocrystalline substrate, but the lattice mismatching rate between the crystal structure of the substrate 1 and that of the zinc oxide is high, a thin film 2 of zinc oxide oriented in the c-axis can be formed. The method used for forming the thin film 2 of zinc oxide is vacuum deposition, such as electron beam evaporation, reactive plasma evaporation, sputtering, or pulse laser deposition. In the vacuum deposition, a film is formed with appropriate conditions (such as the temperature of the substrate and the plasma density) and then the thermal annealing is performed after the film formation to form a thin film 2 of zinc oxide oriented in the c-axis. In order to obtain a thin film 2 of zinc oxide oriented in the c-axis and having low electric resistance, the zinc oxide thin film 2 may be doped with an element, such as Ga, Al, or B.

Subsequently, as shown in FIG. 2B, a phosphor particle layer 4 formed of phosphor particles 3 (i.e., phosphor layer 9 before the formation of the zinc oxide matrix 5) is formed on the zinc oxide thin film 2 formed on the substrate 1. In practice, in the phosphor particle layer 4, the phosphor particles 3 are in contact with one another. However, the drawing illustrates a certain cross section for easy understanding, and therefore phosphor particles are seen to be separated from other phosphor particles. The phosphor particle layer 4 can be formed by producing a dispersion liquid of the phosphor particles 3 and accumulating the phosphor particles 3 on the zinc oxide thin film 2 by electrophoresis. Alternatively, the phosphor particle layer 4 may be formed by precipitating the phosphor particles 3 in the phosphor particle dispersion liquid. Alternatively, the phosphor particle layer 4 may be formed by printing using a paste containing the phosphor particles 3 dispersed therein.

Subsequently, as shown in FIG. 2C, a matrix 5 including zinc oxide can be formed by crystal growth from the zinc oxide thin film 2 by a solution growth method using a solution containing Zn ions. Herein, as described above, the use of the thin film 2 of zinc oxide oriented in the c-axis as a seed crystal can form a matrix 5 of zinc oxide oriented in the c-axis, and the use of the thin film 2 of monocrystalline zinc oxide can form a matrix 5 of monocrystalline zinc oxide. The solution growth method used is, for example, chemical bath deposition performed under atmospheric pressure, hydrothermal synthesis performed under a pressure higher than atmospheric pressure, or electrochemical deposition performed by applying a voltage or current. The solution for crystal growth is, for example, an aqueous zinc nitrate ($Zn(NO_3)_2$) solution containing hexamethylenetramine ($C_6H_{12}N_4$). The aqueous zinc nitrate solution has a pH of, for example, 5 or more and 7 or less. The process of such a solution growth method and the analysis of a crystal are disclosed in, for example, International Publication No. WO2013/172025.

Subsequently, pores 6 are formed inside and on the surface of the zinc oxide crystal of the matrix 5 in order to form a phosphor layer 9 of the wavelength converter 10, as shown in FIG. 2D. The process of forming the pores 6 may include heat treatment. The temperature of heating is desirably 450° C. or more and 1000° C. or less. The heating system can be, for example, a box-type drying furnace/burning furnace, a tubular furnace, or a belt type continuous furnace. The atmosphere for heating can be selected from various oxygen concentration atmospheres, such as air and oxygen atmospheres. The heating profile can be determined considering the heat resistance of the substrate and the heat resistance of the thin film formed on the substrate.

Figure 3:
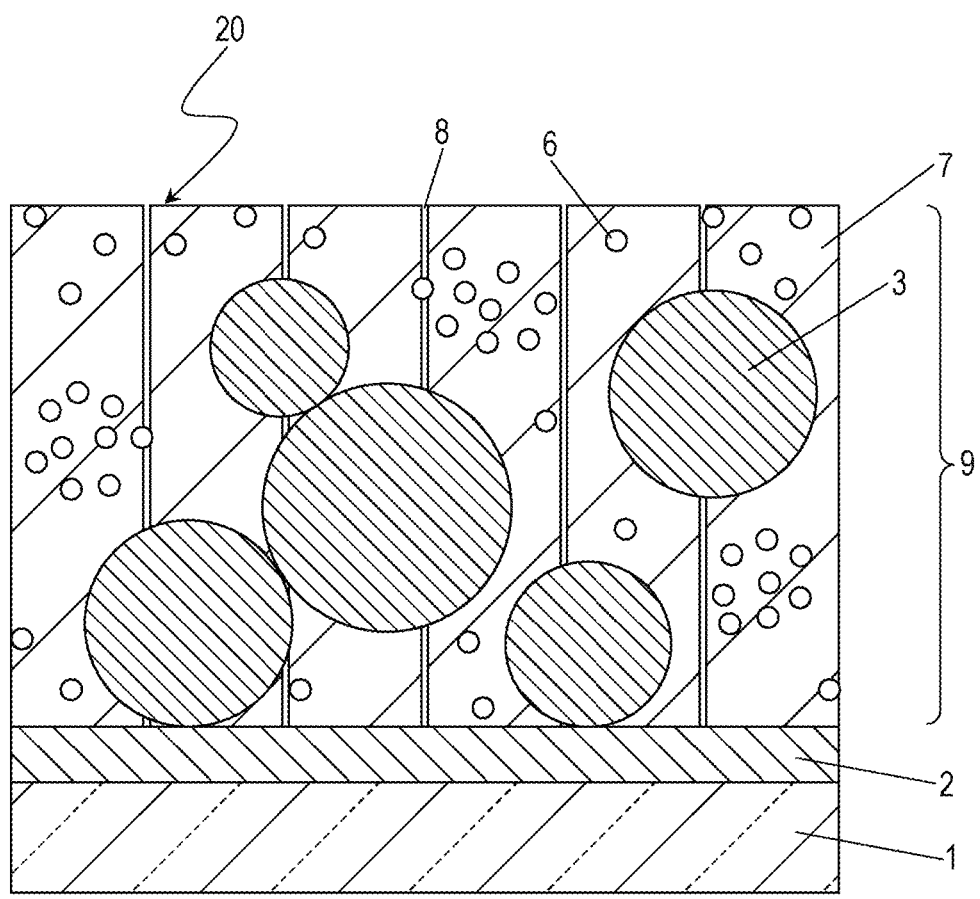
FIG. 3 is a cross-sectional view of a wavelength converter according to the first embodiment of the present disclosure.

FIG. 3 is a cross-sectional view of a wavelength converter in a case of using a columnar crystalline zinc oxide matrix 7 made of zinc oxide oriented in the c-axis in the first embodiment. The crystallite of zinc oxide oriented in the c-axis has a columnar crystal shape, and a crystal grain boundary 8 is present between a columnar crystal and another columnar crystal. FIG. 3 of International Publication No. WO2013/172025 shows a step in the middle of forming a matrix 5 (FIG. 20) made of zinc oxide oriented in the c-axis from zinc oxide oriented in the c-axis by crystal growth. In the solution growth method, the thin film 2 is used as a nucleus crystal to allow crystal growth of zinc oxide oriented in the c-axis sequentially upward from the thin film 2 formed below the phosphor particle layer 4, instead of direct crystal growth of zinc oxide from the phosphor particles 3. FIGS. 24(a) and 24(b) of International Publication No. WO2013/172025 show, in an enlarged form, the appearance of the crystal growth of zinc oxide matrix oriented in the c-axis. In the drawing, for ease of understandings, only one phosphor particle 3 is shown. In the growth of zinc oxide by the solution growth method, the zinc oxide matrix of the phosphor layer 9 is formed by crystal growth in the c-axis direction from the zinc oxide thin film 2. When the zinc oxide crystal grown in the c-axis direction from beneath a phosphor particle 3 hits another phosphor particle 3, the crystal growth stops. As described above, the zinc oxide of each columnar crystal is one crystallite. When columnar crystals of zinc oxide hit each other, a space is formed between the columnar crystals and remains as a void. That is, the voids are formed between crystallites. In other words, a void can be formed on the surface of a crystallite, but is not formed inside a crystallite. The width of the columnar crystal varies depending on the crystallinity of the seed crystal and the degree of lateral growth in the horizontal direction. The columnar crystal has a width of, for example, 0.1 to 0.4 μm. The length of the columnar crystal varies depending on the distance until the crystallite hits a phosphor particle 3. The columnar crystal has a length of, for example, 1.4 to 2.4 μm.

As shown in FIG. 3 of International Publication No. WO2013/172025, since a zinc oxide crystal grow through the voids inside the phosphor particle layer 4, rod-like zinc oxide grown from the narrow gaps between phosphor particles 3 on the surface of the phosphor layer 9 may form an irregular structure on the surface of the phosphor layer 9. In such a case, reflection of light due to the difference in the index of refraction between the phosphor layer 9 and air can be reduced.

The wavelength converter 20 of the embodiment also includes a phosphor layer 9 including phosphor particles 3, a columnar crystalline zinc oxide matrix 7 located between the phosphor particles 3, and pores 6 located inside and on the surface of the matrix. At least one of the columnar crystals includes pores 6 therein. The wavelength converter 20 converts at least part of incident light to light having a wavelength band different from that of the incident light and emits the light. Specifically, for example, the wavelength converter 20 emits light having a wavelength longer than that of the incident light.

The wavelength converters 10 and 20 of this embodiment can be each used as a wavelength converter in, for example, an ordinary lighting system, such as a ceiling light; a special lighting system, such as a spotlight, a light for stadium, or a light for studio; a lighting system for a vehicle, such as a head lamp; a projector or head up display projector; a light for an endoscope; an imaging apparatus, such as a digital camera, a mobile phone, or a smartphone; or a liquid crystal display of, for example, a monitor for a personal computer (PC), a notebook personal computer, a television, a personal digital assistant (PDA), a smartphone, a tablet PC, or a mobile phone.

Second Embodiment

Figure 4:
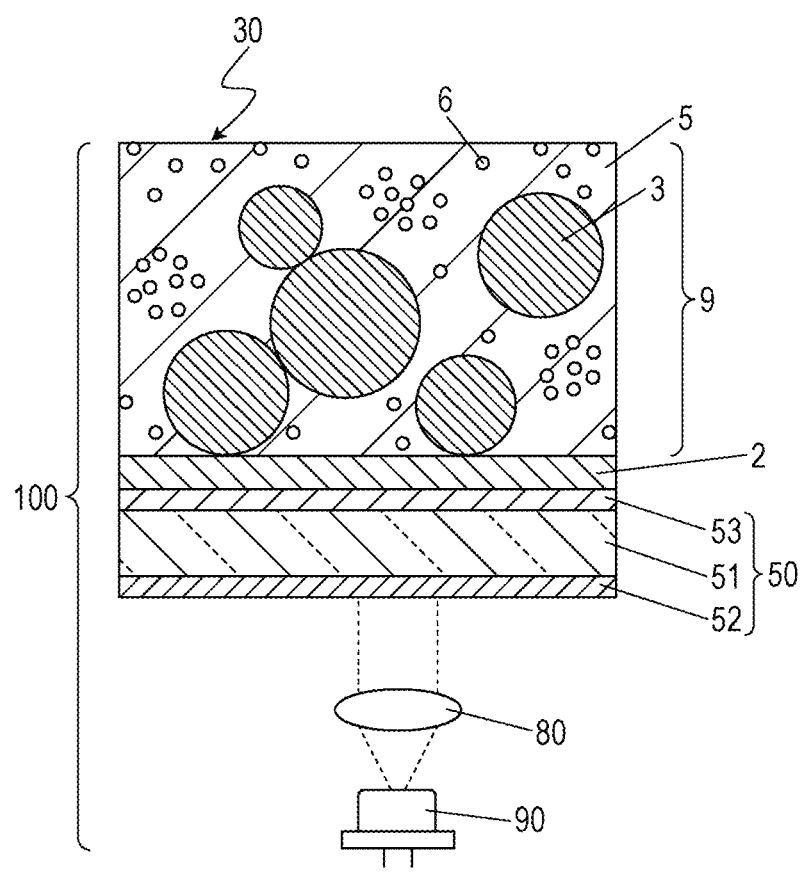
FIG. 4 is a cross-sectional view of a transmission-type light source according to a second embodiment of the present disclosure.

FIG. 4 shows a schematic structure of a transmission-type light source 100 according to a second embodiment of the present disclosure. The same members as those in the first embodiment are denoted by the same reference symbols, and the descriptions thereof are omitted. The transmission-type light source 100 includes a wavelength converter 30 and a semiconductor light emitting device 90. The wavelength converter 30 at least includes a light transmissive substrate 50 and a phosphor layer 9. The wavelength converter 30 converts at least part of incident light to light having a wavelength band different from that of the incident light and emits the light. Specifically, for example, the wavelength converter 30 emits light having a wavelength longer than that of the incident light.

The semiconductor light emitting device 90 includes, for example, a light-emitting layer formed from a nitride semiconductor and emits excitation light. As the semiconductor light emitting device 90, for example, a laser diode (LD) or a light emitting diode (LED) can be used. The semiconductor light emitting device 90 may be made of one LD or may be an optical combination of a plurality of LDs. An incidence optical system 80 for guiding the light of the semiconductor light emitting device 90 to the phosphor layer 9 may be disposed between the wavelength converter 30 and the semiconductor light emitting device 90. The incidence optical system 80 includes, for example, a lens, a mirror, an optical fiber, or a combination of any of them. The semiconductor light emitting device 90 has an emission peak wavelength of, for example, 420 nm or more and 470 nm or less. The emission light from the semiconductor light emitting device 90 has an energy density of, for example, 11.4 W/mm$^2$ or more. The emission light from the semiconductor light emitting device 90 may have an energy density equal to or more than 11.4 W/mm$^2$ and equal to or less than 300 W/mm$^2$.

In this embodiment, a case that the semiconductor light emitting device 90 is an LD emitting blue excitation light will be described. In the present disclosure, the term "blue light" refers to light having an emission peak wavelength of 420 nm or more and 470 nm or less.

The light transmissive substrate 50 can transmit light of 470 nm or less. The light transmissive substrate 50 may include a substrate 51, an antireflection film 52, and a dichromic mirror 53.

The substrate 51 constituting the light transmissive substrate 50 may be made of, for example, one selected from the group consisting of glass, quartz, silicon oxide, sapphire, gallium nitride, and zinc oxide.

The antireflection film 52 may be a dielectric multilayer film that prevents the reflection of light having a wavelength of 470 nm or less. The antireflection film 52 can prevent the reflection of excitation light incident on the wavelength converter, leading to an improvement in the luminous efficiency of the light source. As shown in FIG. 4, the antireflection film 52 is disposed, for example, on the surface of the substrate 51 on which excitation light is incident.

The dichromic mirror 53 may be a dielectric multilayer film having optical characteristics of transmitting light having a wavelength of less than 470 nm and reflecting light having a wavelength of 470 nm or more. The dichromic mirror 53 can reflect light, converted in wavelength by the phosphor layer 9 and radiated in the direction toward the substrate, into the extraction direction. Therefore, the luminous efficiency of the light source is enhanced. As shown in FIG. 4, the dichromic mirror 53 is disposed between the substrate 51 and the phosphor layer 9.

The dielectric multilayer film used for the antireflection film 52 or the dichromic mirror 53 can be composed of two or more materials, a low index of refraction layer and a high index of refraction layer. The material of the low index of refraction layer is, for example, silicon oxide. The material of the high index of refraction layer is, for example, niobium oxide, tantalum oxide, or zirconium oxide.

The wavelength converter 30 and the transmission-type light source 100 of the second embodiment can be respectively used as a wavelength converter and a light source in, for example, an ordinary lighting system, such as a ceiling light; a special lighting system, such as a spotlight, a light for stadium, or a light for studio; a lighting system for a vehicle, such as a head lamp; a projector or head up display projector; a light for an endoscope; an imaging apparatus, such as a digital camera, a mobile phone, or a smartphone; or a liquid crystal display of, for example, a monitor for a personal computer (PC), a notebook personal computer, a television, a personal digital assistant (PDA), a smartphone, a tablet PC, or a mobile phone.

Third Embodiment

Figure 5:
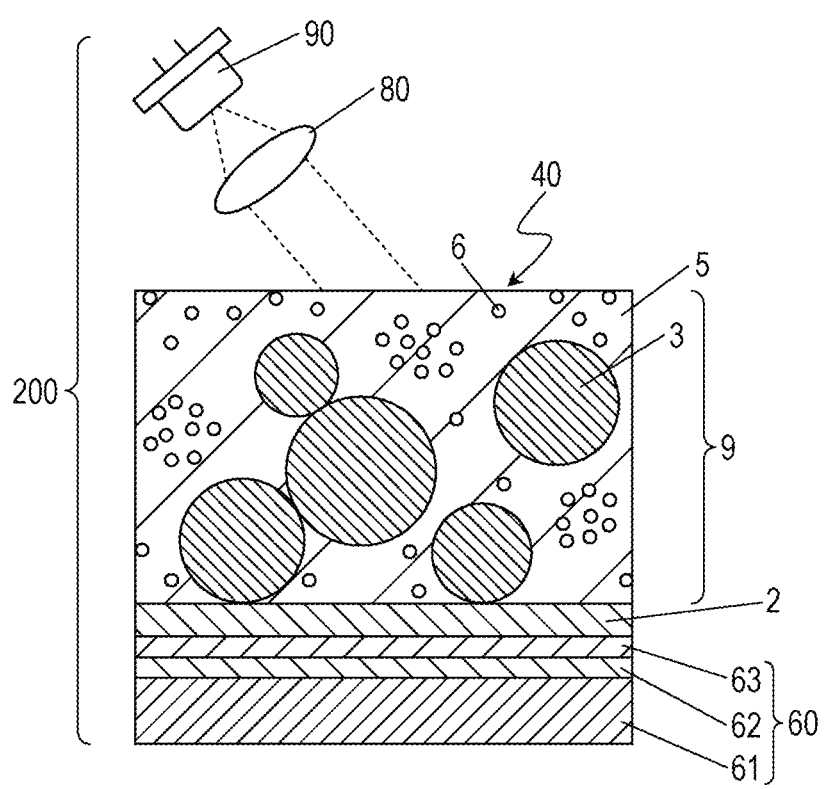
FIG. 5 is a cross-sectional view of a reflection-type light source according to a third embodiment 3 of the present disclosure.

FIG. 5 shows a schematic structure of a reflection-type light source 200 according to a third embodiment of the present disclosure. The same members as those in the first or second embodiment are denoted by the same reference symbols, and the descriptions thereof are omitted. The reflection-type light source 200 includes a wavelength converter 40 and a semiconductor light emitting device 90. The wavelength converter 40 at least includes a reflecting substrate 60 and a phosphor layer 9. The wavelength converter 40 converts at least part of incident light from the upper side to light having a wavelength band different from that of the incident light and emits the light. Specifically, for example, the wavelength converter 40 emits light having a wavelength longer than that of the incident light.

The reflecting substrate 60 can reflect at least light of 420 to 780 nm. The substrate 61 of the reflecting substrate 60 may contain, for example, at least one selected from silicon, aluminum, sapphire, gallium nitride, and aluminum nitride. The substrate 61 may be provided with a reflection film 62 that reflects, for example, light of 420 to 780 nm. Furthermore, a thin film 63, which functions as a reflection enhancing film for increasing the reflectivity of the reflection film 62, a protective film for protecting the reflection film 62, or a buffer layer for forming a thin film 2 of monocrystalline zinc oxide, may be formed.

The light converted in wavelength by the phosphor layer 9 is reflected by the reflecting substrate 60 and can be efficiently extracted to the outside from the upper surface of the phosphor layer 9. The wavelength converter 40 and the reflection-type light source 200 of the third embodiment can be used in the same application as that in the light source 100 of Embodiment 2.

Fourth Embodiment

A fourth embodiment relates to a lighting system including the light source according to the second or third embodiment. Examples of the lighting system include ordinary lighting systems, such as ceiling lights; special lighting systems, such as a spotlights, lights for stadium, and lights for studio; and lighting systems for vehicles, such as head lamps. The lighting system is useful when a high intensity of illumination is required, that is, when the lighting system is constituted as a special lighting system or a lighting system for a vehicle. The term "vehicle" in the present disclosure refers to, for example, an automobile, a railroad car, a tramcar, a motorcycle (e.g., motorbike), or a special-purpose vehicle (e.g., construction vehicle or agricultural vehicle).

As an example, a case of constituting the lighting system of this embodiment as a lighting system for a vehicle (head lamp) will be described.

Figure 6:
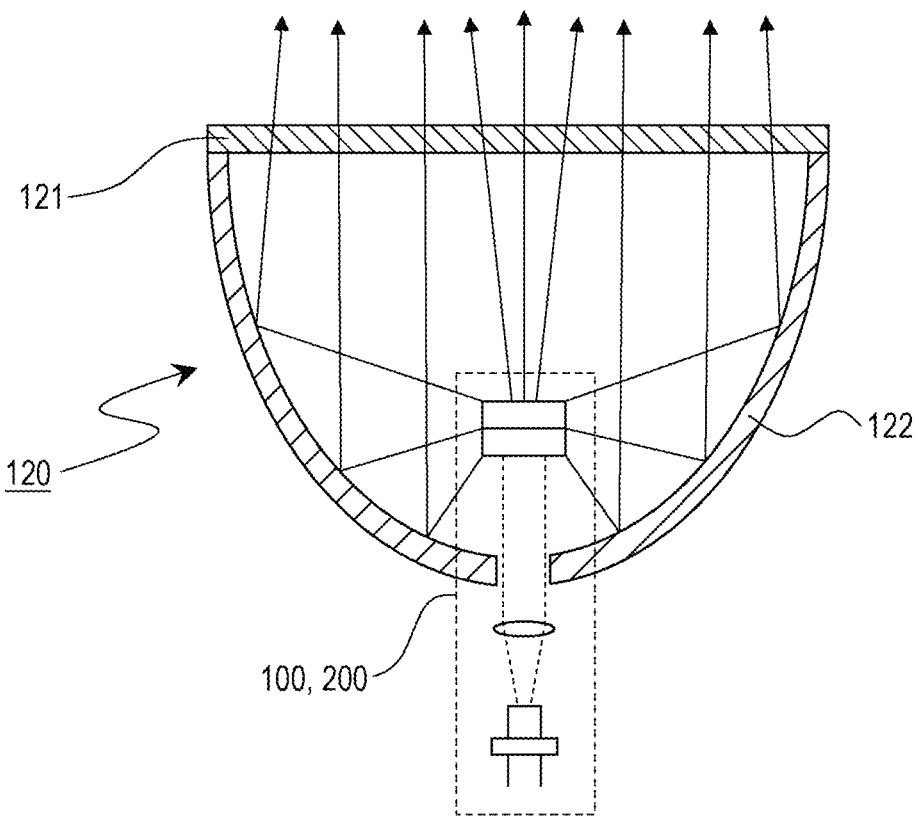
FIG. 6 is a schematic configuration diagram illustrating the structure of a lighting system (head lamp for a vehicle) according to a fourth embodiment of the present disclosure.

FIG. 6 shows a schematic structure of a head lamp for a vehicle 120 according to the fourth embodiment of the present disclosure. The head lamp for a vehicle 120 of this embodiment includes the transmission-type light source 100 of the second embodiment or the reflection-type light source 200 of the third embodiment and an emission optical system 122 for radiating the light from the light source ahead. In order to prevent the coherent blue light from directly exiting to the outside from the semiconductor light emitting device of the light source, a scattering plate 121 for scattering blue light may be provided. The emission optical system 122 is, for example, a reflector. The emission optical system 122 includes a metal film, such as Al and Ag, or an Al film provided with a protective film on the surface. The head lamp for a vehicle 120 may be of a so-called reflector type or of a projector type.

The fourth embodiment can provide a lighting system having a high output and a high luminous efficiency.

Fifth Embodiment

A fifth embodiment relates to a vehicle including the lighting system according to the fourth embodiment as a lighting system. The vehicle may be an engine vehicle, an electric vehicle, or a hybrid vehicle.

Figure 7:
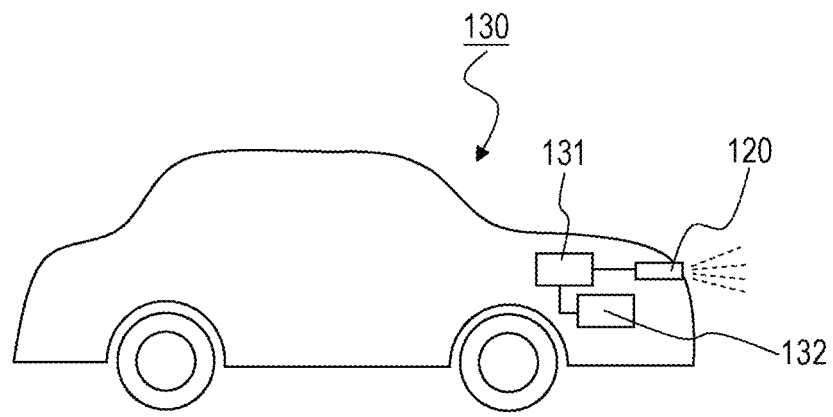
FIG. 7 is a schematic configuration diagram illustrating a vehicle according to a fifth embodiment of the present disclosure.

FIG. 7 shows a schematic structure of a vehicle 130 according to the fifth embodiment of the present disclosure. The vehicle 130 includes the head lamp for a vehicle 120 described as an example of the fourth embodiment and a power supply source 131. The vehicle 130 is rotary-driven by a driving source, such as an engine, and may include a generator 132 generating electric power. The electric power generated by the generator 132 is stored in the power supply source 131. The power supply source 131 is a secondary battery capable of charging and discharging. The head light 120 for a vehicle is turned on by the electric power from the power supply source 131.

The fifth embodiment can provide a vehicle including a lighting appliance having a high output and a high luminous efficiency.

EXAMPLES

The present disclosure will now be described in detail by examples and comparative examples. The present disclosure is not limited to the following examples.

Example 1

(Formation of Thin Film of Zinc Oxide on Substrate)
A sapphire substrate having a thickness of 0.33 mm was prepared. On the excitation light incidence side of the substrate, an antireflection film made of a silicon oxide/tantalum oxide dielectric multilayer film that prevents the reflection of excitation light was formed. On the phosphor layer side of the substrate, a dichromic mirror made of a silicon oxide/tantalum oxide dielectric multilayer film that has optical characteristics of transmitting light having a wavelength of less than 470 nm and reflecting light having a wavelength of 470 nm or more was formed. Subsequently, a thin film made of c-axis-oriented zinc oxide doped with 3 at % of Ga and having a thickness of 150 nm was formed on the dichromic mirror of the substrate by sputtering.
(Formation of Phosphor Particle Layer)
A phosphor particle dispersion liquid was prepared using an $Y_3Al_5O_{12}$:Ce (YAG:Ce) having an average particle diameter of 9 μm. Note that, in this disclosure, an average particle diameter is a median diameter D50 determined from a volume distribution measured with a laser diffraction particle size distribution measuring apparatus. The concentration of the phosphor particles was appropriately adjusted according to the desired thickness of the phosphor film. YAG:Ce phosphor particles (0.2 g) were mixed with phosphate ester (0.0003 g) and polyethylene imine (0.0003 g) serving as dispersants in a dispersion solvent ethanol (30 mL). The phosphor particles were dispersed in the solvent with an ultrasonic homogenizer. Using the resulting phosphor particle dispersion liquid, a phosphor particle layer was formed on the substrate provided with the zinc oxide thin film by electrophoresis under deposition conditions using the zinc oxide thin film as the cathode and the Pt electrode as the anode and applying a voltage of 100 V for 3 minutes. After the deposition of the phosphor particle layer, the ethanol as the solvent was dried to complete the formation of the phosphor particle layer. The phosphor particle layer had a thickness of 32 μm.
(Formation of Zinc Oxide Matrix in Spaces Inside Phosphor Particle Layer)
Chemical bath deposition was used as the solution growth method of zinc oxide forming a matrix. An aqueous solution containing zinc nitrate (0.1 mol/L) and hexamethylene tetramine (0.1 mol/L) was prepared as a zinc oxide growth solution. The solution had a pH of 5 to 7. The substrate provided with a phosphor particle layer was immersed in the zinc oxide growth solution, and the temperature of the solution was maintained at 90° C. to grow a crystal of zinc oxide oriented in the c-axis in the spaces inside the phosphor particle layer. The substrate was then taken out, washed with pure water, and dried.
(Treatment of Zinc Oxide Matrix for Forming Pores)
After the formation of zinc oxide matrix oriented in the c-axis in the spaces inside the phosphor particle layer, pores were formed in the zinc oxide matrix by heat treatment. The heat treatment was performed using a box-type burning furnace under an air atmosphere. The temperature of pore-forming treatment in this heat treatment was adjusted to 450° C. The heating profile included a rise in temperature for 30 minutes from 25° C. to the temperature for pore-forming treatment (i.e., 450° C.), a retention at the temperature for 20 minutes, and natural cooling. After the natural cooling, the substrate was taken out.
(Mounting on Transmission-Type Light Source and Evaluation)
The wavelength converter formed in Example 1 was mounted on the transmission-type light source shown in FIG. 4. The metal chassis of the transmission-type light source holding the substrate of the wavelength converter was cooled with a fan. An LD having an emission peak wavelength at 445 nm was used as the semiconductor light emitting device of the transmission-type light source. A phosphor layer was excited by using an optical component between the LD and the wavelength converter at an LD light output of 2.5 W and an excitation light energy density of 19 W/mm². The light from the phosphor layer by this excitation was incorporated into an integrating sphere, and the color temperature of the light source and the luminous efficiency (lm/$W_{LD}$) per 1 W of the LD light output were measured with a total luminous flux measuring system (FM-9100) manufactured by Otsuka Electronics Co., Ltd. The temperature of the phosphor layer of the wavelength converter was measured with an infrared thermography device (FLIR T640) manufactured by FLIR Systems Japan K.K. The results of these measurements are shown in Table 1. The values of the luminous efficiency shown in the table are relative values with the luminous efficiency in Reference Example 1 defined as 100%.

Comparative Example 1

A wavelength converter was formed as in Example 1 except that the thickness of the phosphor layer was 32 and that after the formation of zinc oxide as the matrix of a phosphor layer, the pore-forming treatment was not performed. The wavelength converter and the transmission-type light source were evaluated. The results are shown in Table 1.

Reference Example 1

A sapphire substrate provided with an antireflection film on the excitation light incidence side of the substrate and a dichromatic mirror on the phosphor layer side of the substrate was prepared as in Example 1 except that a thin film of zinc oxide was not formed. A silicone resin prepared by mixing the same weights of the A-agent and B-agent of a dimethyl silicone resin was mixed with the same phosphor as that in Example 1 such that the amount of the phosphor in the resulting phosphor layer was 40 vol %. The mixture was fed to a three-roll kneader three times for vacuum defoaming to obtain a silicone resin mixture. The resulting silicone resin mixture was then applied onto the substrate and was cured at 150° C. for 4 hours to form a phosphor layer (thickness: 39 μm) including the silicone resin as the matrix. Subsequently, the wavelength converter and the transmission-type light source were evaluated as in Example 1. In the wavelength converter including silicone of Reference Example 1, the phosphor temperature reached 227° C. at 2 W and an excitation light energy density of 15.2 W/mm². The results are shown in Tables 1 to 3.

Example 2

A wavelength converter was formed as in Example 1 except that the thickness of the phosphor layer was 33 μm and that the pore-forming treatment of the zinc oxide matrix of the phosphor layer was performed at 500° C. The wavelength converter and the transmission-type light source were evaluated. The results are shown in Table 2.

Comparative Example 2

A wavelength converter was formed as in Example 2 except that after the formation of zinc oxide as the matrix of a phosphor layer, the pore-forming treatment was not performed. The wavelength converter and the transmission-type light source were evaluated. The results are shown in Table 2.

Example 3

A wavelength converter was formed as in Example 1 except that the thickness of the phosphor layer was 28 μm and that the pore-forming treatment of the zinc oxide matrix of the phosphor layer was performed at 500° C. The wavelength converter and the transmission-type light source were evaluated. The results are shown in Table 3.

Comparative Example 3

A wavelength converter was formed as in Example 3 except that after the formation of zinc oxide as the matrix of a phosphor layer, the pore-forming treatment was not performed. The wavelength converter and the transmission-type light source were evaluated. The results are shown in Table 3.

Comparative Example 4

A wavelength converter was formed as in Example 3 except that the pore-forming treatment of the zinc oxide matrix of the phosphor layer was performed at 225° C. The wavelength converter and the transmission-type light source were evaluated. The results are shown in Table 3.

Figure 8:
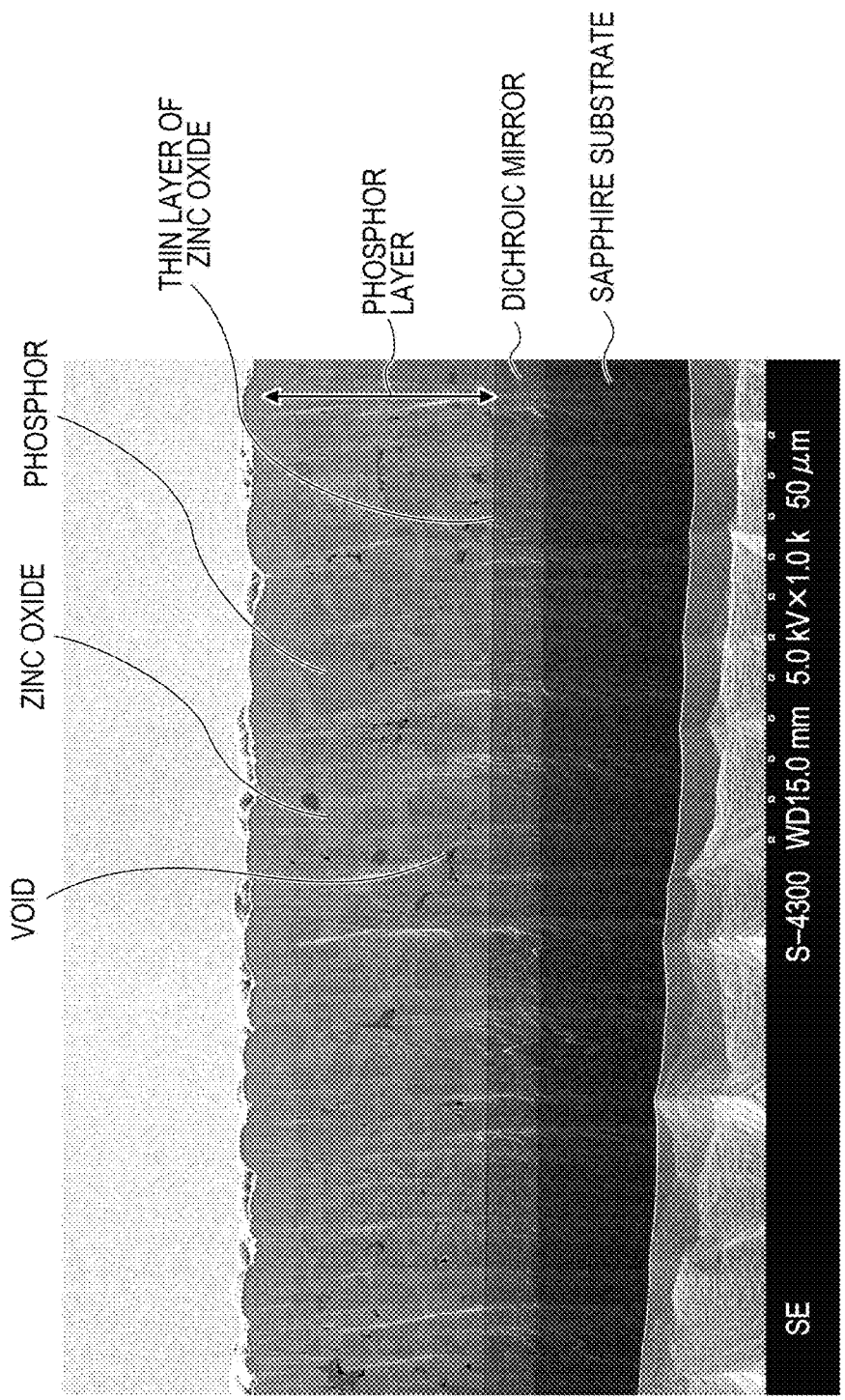
FIG. 8 is a cross-sectional SEM (scanning electron microscope) observation image of a wavelength converter of Example 3.

Observation of a cross section and measurement of the thickness of the phosphor layer were performed using a scanning electron microscope (SEM). FIG. 8 shows a cross-sectional SEM observation image of the wavelength converter of Example 3. The cross section of this cross-sectional SEM observation was formed by processing the surface appeared by breaking the phosphor layer of Example 3 with a cross section polisher (CP). When the cross section for observation is formed by processing the surface appeared by breaking a phosphor layer with a CP, since the cross section is processed by ion beams, the shape of the cross section and the shape and amount of the pores can be well observed. However, the conditions of the crystal grain boundaries of zinc oxide cannot be inspected after the CP processing. In the specification, the surface appeared by breaking and not subjected to CP processing is referred to as "fractured surface".

As shown in FIG. 8, it was confirmed that zinc oxide becoming a matrix was satisfactorily formed in the spaces inside the phosphor particle layer and that the amount of voids was low. The phosphor layer had a thickness of 28 μm.

Figure 9:
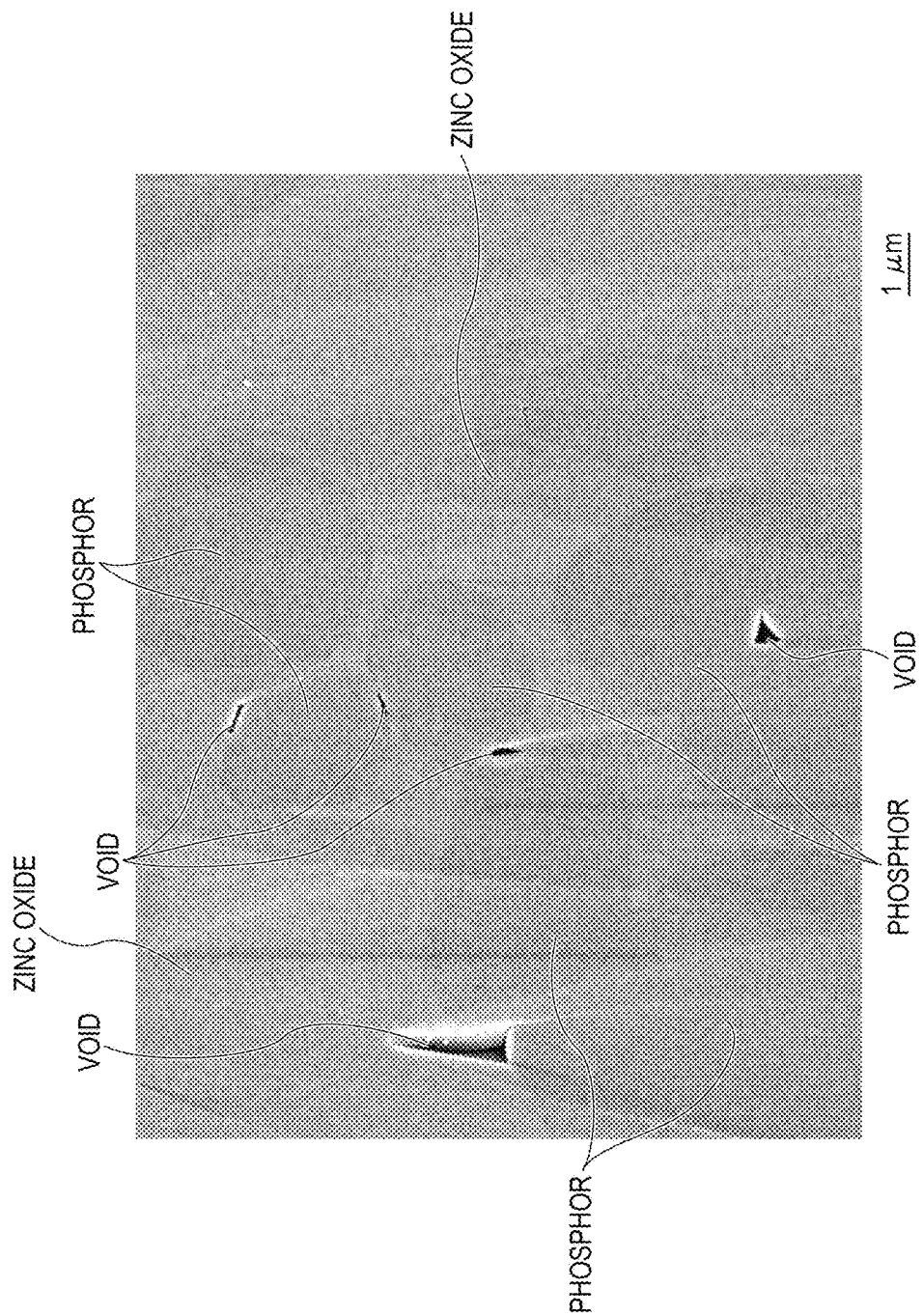
FIG. 9 is a cross-sectional SEM observation image of a wavelength converter of Comparative Example 3.

FIG. 9 shows a cross-sectional SEM observation image of the phosphor layer of the wavelength converter of Comparative Example 3, wherein the zinc oxide matrix was not subjected to pore treatment. As shown in FIG. 9, it was confirmed that voids were partially formed in the upper portion of the phosphor particle and between the phosphor particles before the pore treatment of the zinc oxide matrix, but pores were not formed in the zinc oxide matrix.

Figure 10:
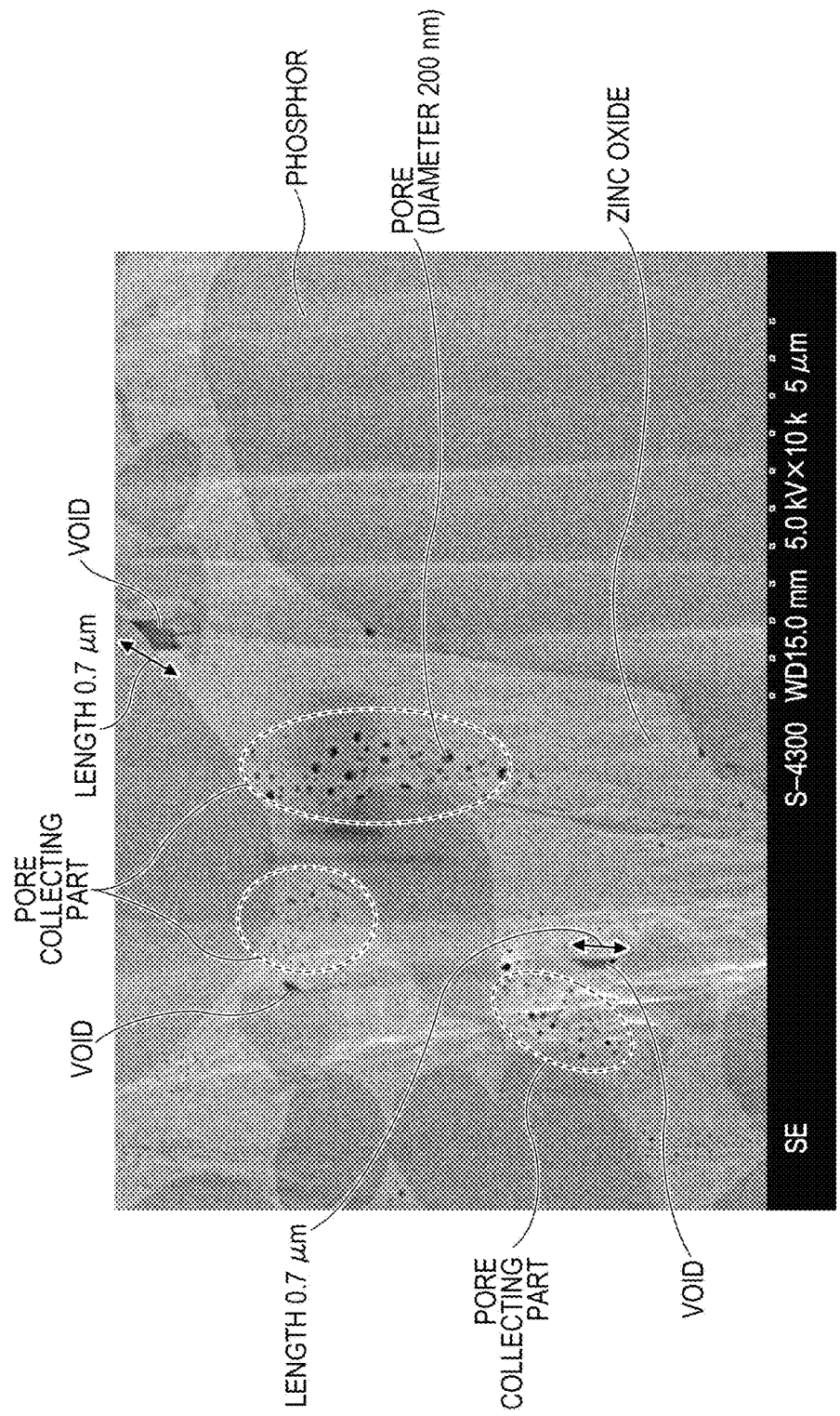
FIG. 10 is a cross-sectional SEM observation image of a wavelength converter of Example 3.
Figure 11:
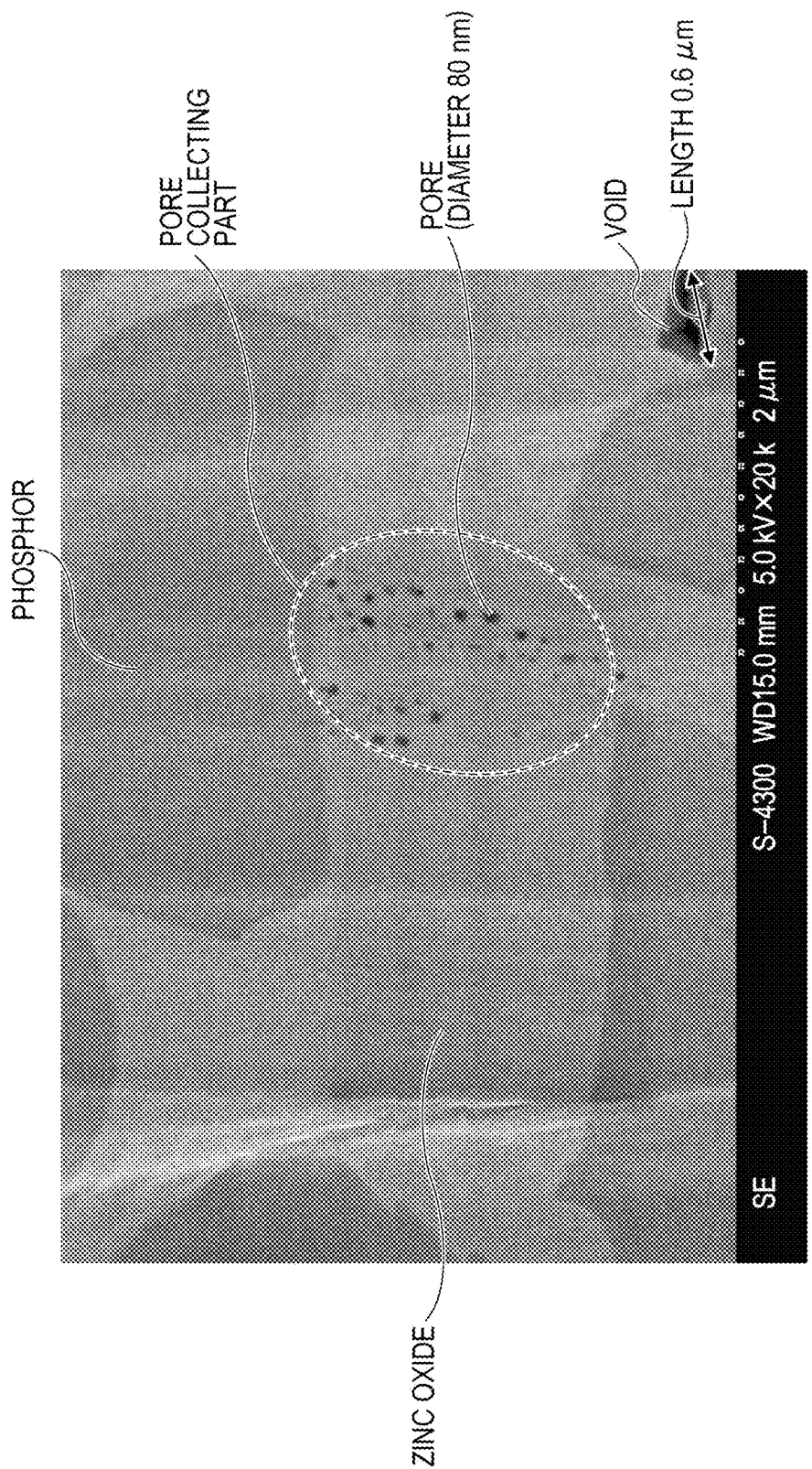
FIG. 11 is a cross-sectional SEM observation image of the wavelength converter of Example 3.

FIGS. 10 and 11 show cross-sectional SEM observation images of the phosphor layer of the wavelength converter of Example 3 in which the pore treatment of the zinc oxide matrix was performed at 500° C. It was confirmed that the zinc oxide matrix after the pore treatment included pores, which was not observed in Comparative Example 3, in addition to the voids. The smallest pore that could be observed had a diameter of 10 nm, and there were pores having a larger diameter of, for example, 80 nm or 200 nm. The results of the cross-sectional observation demonstrated that the pores were not uniformly formed in the zinc oxide matrix and that the pores gathered and formed pore collecting parts. In addition, no cracks were observed in the zinc oxide matrix.

Figure 12:
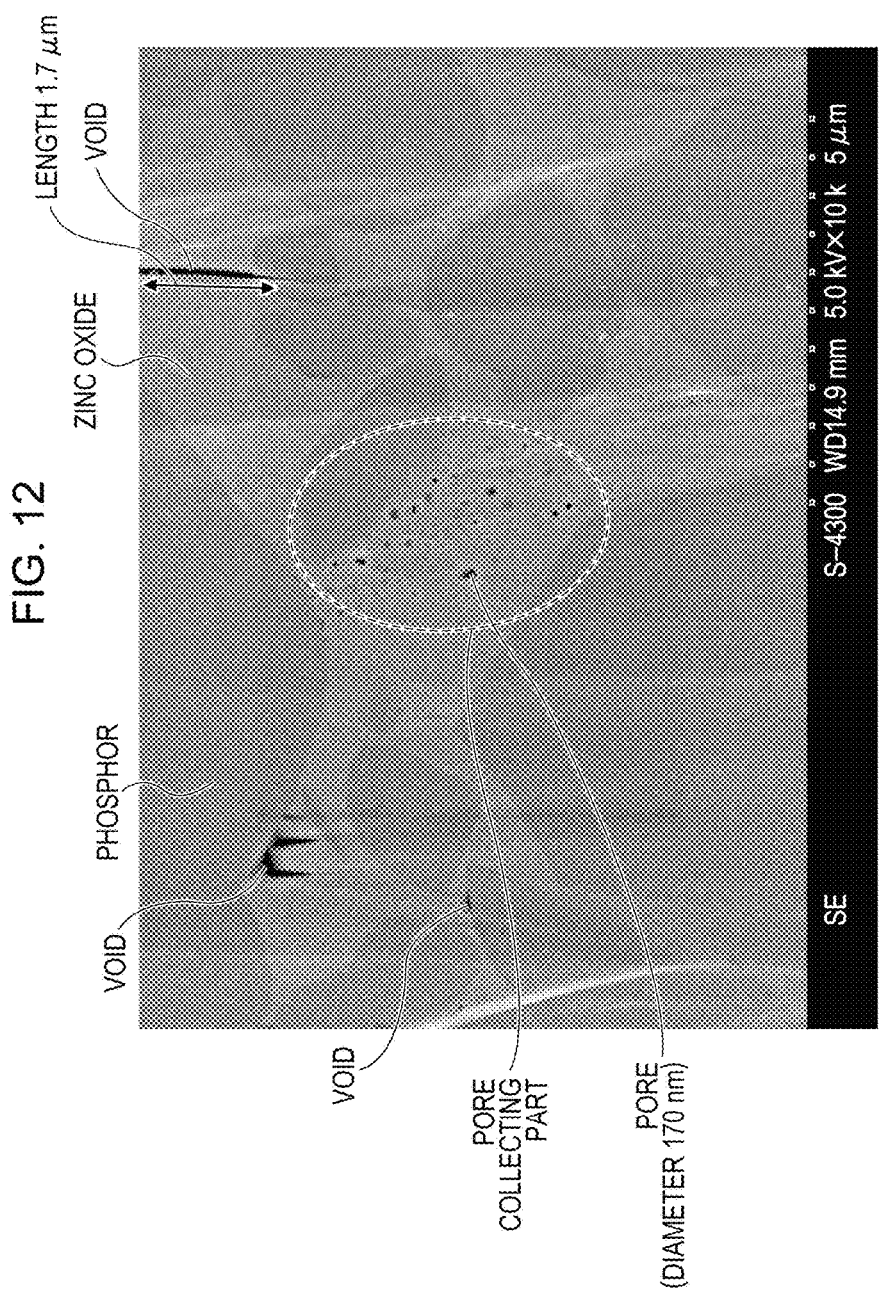
FIG. 12 is a cross-sectional SEM observation image of a wavelength converter of Example 1.
Figure 13:
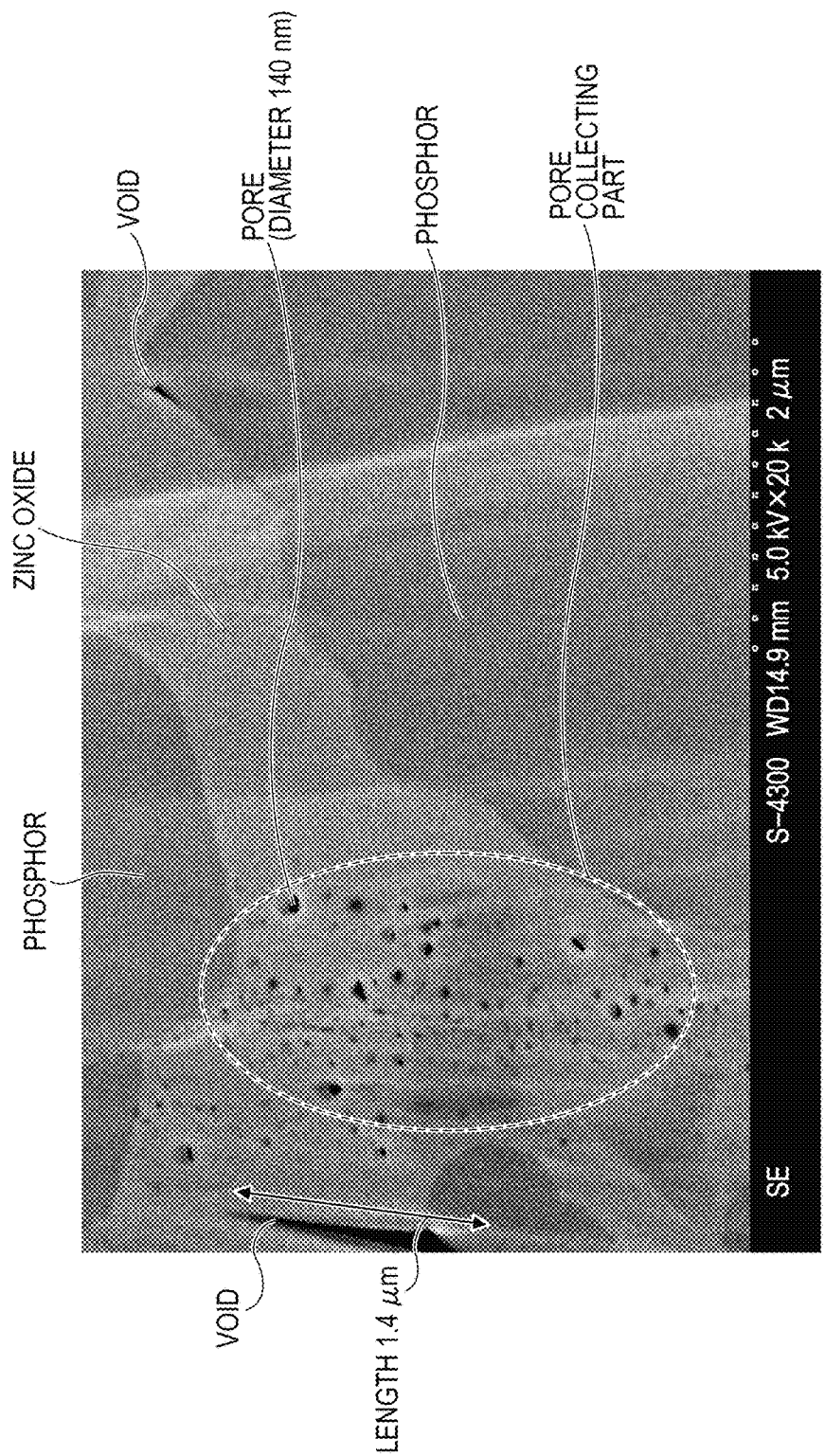
FIG. 13 is a cross-sectional SEM observation image of a wavelength converter of Example 1.

FIGS. 12 and 13 show cross-sectional SEM observation images of the phosphor layer of the wavelength converter of Example 1 in which the pore treatment of the zinc oxide matrix was performed at 450° C. It was also confirmed that the wavelength converter of Example 1 included pores, in addition to the voids. As in Example 3, the results of the cross-sectional observation demonstrated that the pores were not uniformly formed in the zinc oxide matrix and that the pores gathered and formed pore collecting parts. The smallest pore that could be observed had a diameter of 10 nm, and there were pores having a larger diameter of, for example, 140 nm or 170 nm. It was demonstrated that a lower temperature of the pore treatment makes the diameter of the pore small. In addition, no cracks were observed in the zinc oxide matrix.

Figure 14:
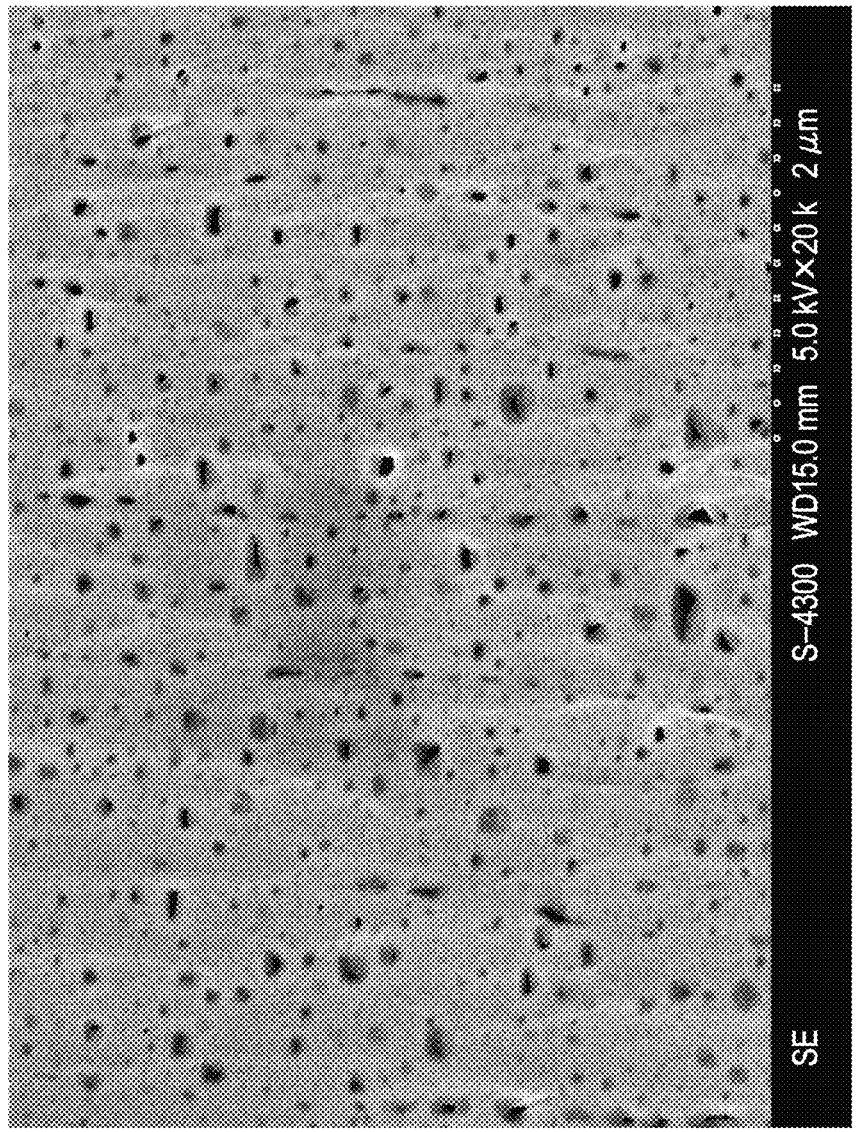
FIG. 14 is a cross-sectional SEM observation image of a zinc oxide film after pore treatment at 500° C.

FIG. 14 shows a cross-sectional SEM observation image of a zinc oxide film after pore treatment at 500° C., where the zinc oxide film was formed on a substrate as in Example 3 except that the phosphor particle layer was not formed. Unlike the case of including phosphor particles and a zinc oxide matrix between the phosphor particles, the pores were uniformly formed in the zinc oxide film. In addition, the zinc oxide film subjected to the pore treatment at 500° C. had cracks and was partially peeled and detached from the substrate. The area of the pores calculated from the SEM image was 9% of the total area.

Figure 15:
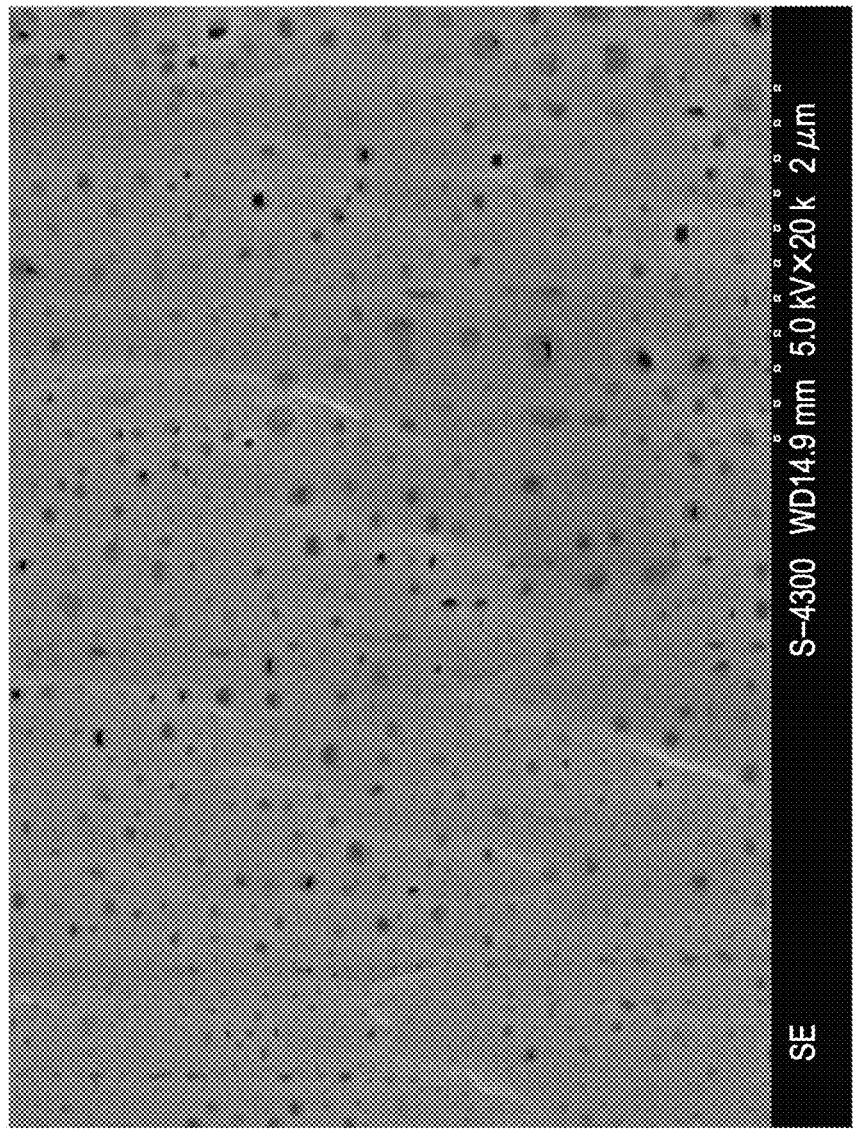
FIG. 15 is a cross-sectional SEM observation image of a zinc oxide film after pore treatment at 450° C.

FIG. 15 shows a cross-sectional SEM observation image of a zinc oxide film after pore treatment at 450° C., where the zinc oxide film was formed on a substrate as in Example 1 except that the phosphor particle layer was not formed. It was confirmed that also when the pore treatment was performed at 450° C., pores were uniformly formed in the zinc oxide film as in the case of pore treatment at 500° C. In addition, the zinc oxide film subjected to the pore treatment at 450° C. also had cracks. The area of the pores calculated from the SEM image was 7% of the total area.

The comparison between FIG. 14 and FIG. 15 demonstrates that the pores formed by pore treatment at 500° C. had a diameter larger than that of the pores formed at 450° C.

Figure 16B:
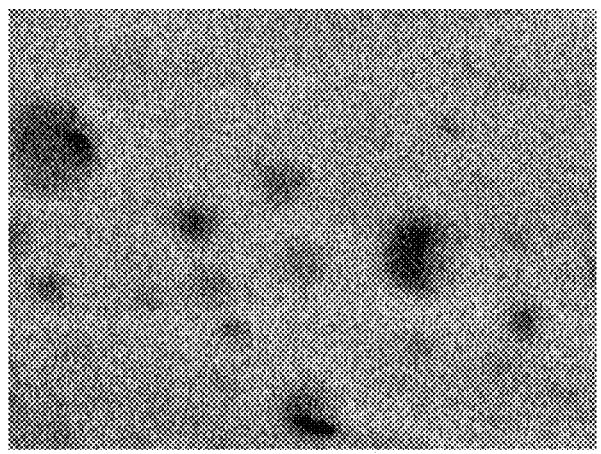
FIGS. 16A and 16B are cross-sectional SEM observation images of pore collecting parts of the wavelength converter of Example 3.
Figure 16A:
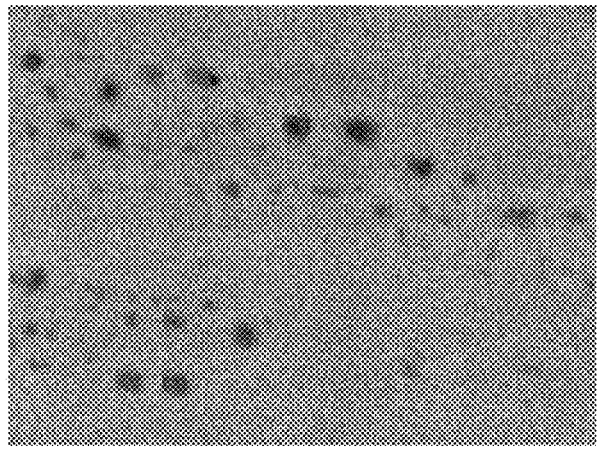

FIGS. 16A and 16B are enlarged views (the magnifications are different from each other) of the pore collecting parts in cross-sectional SEM observation images of the phosphor layer of the wavelength converter of Example 3 in which the pore treatment was performed at 500° C. The pore ratios of the pore collecting parts calculated from the SEM images were respectively 3% and 6%. The total area of the pores in the pore collecting parts was 5% of the sum of the areas of the pore collecting parts in FIGS. 16A and 16B.

FIGS. 17A to 17C are enlarged views (the magnifications are different from one another) of the pore collecting parts in cross-sectional SEM observation images of the phosphor layer of the wavelength converter of Example 1 in which the pore treatment was performed at 450° C. The pore ratios of the pore collecting parts calculated from the SEM images were respectively 2%, 4%, and 5%. The total area of the pores in the pore collecting parts was 4% of the sum of the areas of the pore collecting parts in FIGS. 17A to 17C. In Examples 1 and 3, no cracks were observed.

As described above, cracks were observed in pore treatment of a zinc oxide film not containing phosphor particles, whereas in pore treatment of a zinc oxide matrix formed between phosphor particles, no cracks were observed in the zinc oxide matrix. The reasons for this were presumed by the present inventors as follows: Since a zinc oxide film not containing phosphor particles has a large amount of pores in a cross section, the mechanical strength of the film is decreased, resulting in occurrence of cracks. In contrast, a zinc oxide matrix formed between phosphor particles has a small amount of pores in a cross section, and the mechanical strength of the phosphor layer is probably not decreased, resulting in no occurrence of cracks.

Figure 18A:
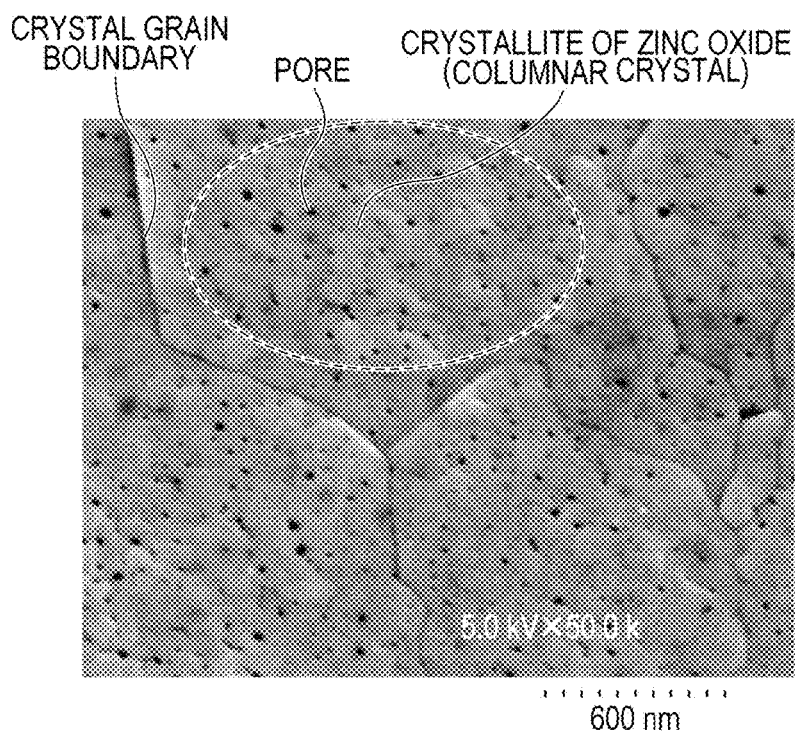
FIG. 18A is a planar SEM observation image of zinc oxide columnar crystals of the wavelength converter of Example 3.
Figure 18B:
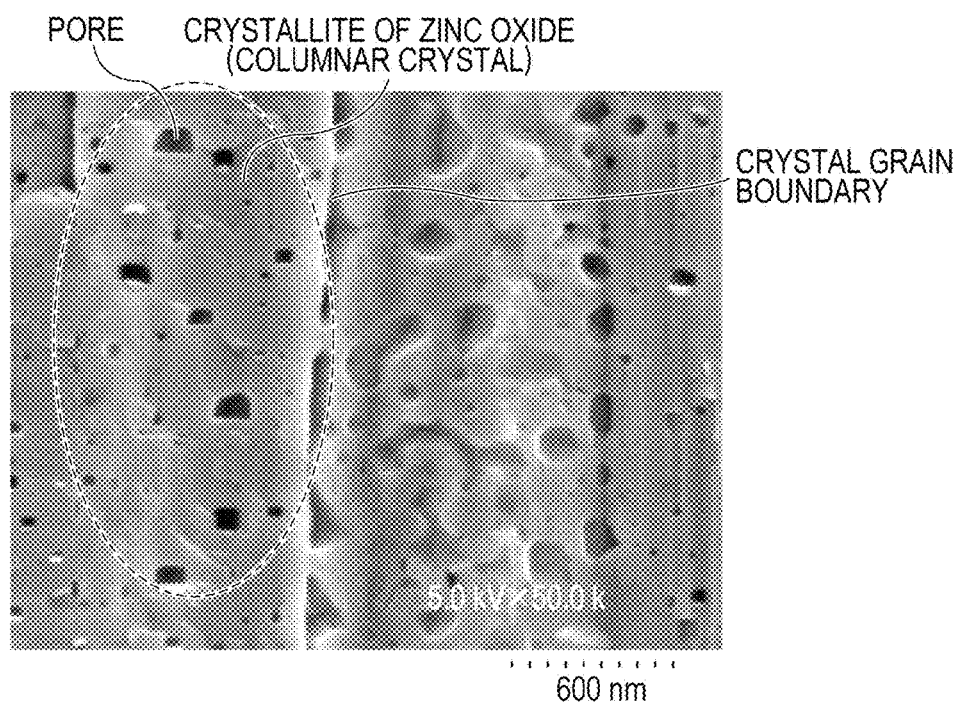
FIG. 18B is a cross-sectional SEM observation image of the surface breaking the zinc oxide columnar crystals of the wavelength converter of Example 3.

FIGS. 18A and 18B are enlarged SEM observation images of zinc oxide columnar crystals of the phosphor layer of the wavelength converter of Example 3. FIG. 18A is a planar image, and FIG. 18B is a cross-sectional image of a fractured surface of the phosphor layer. FIGS. 18A and 18B demonstrated that the zinc oxide crystallites divided by crystal grain boundaries were columnar crystals and that pores were formed inside and on the surface of the crystallites.

Figure 19:
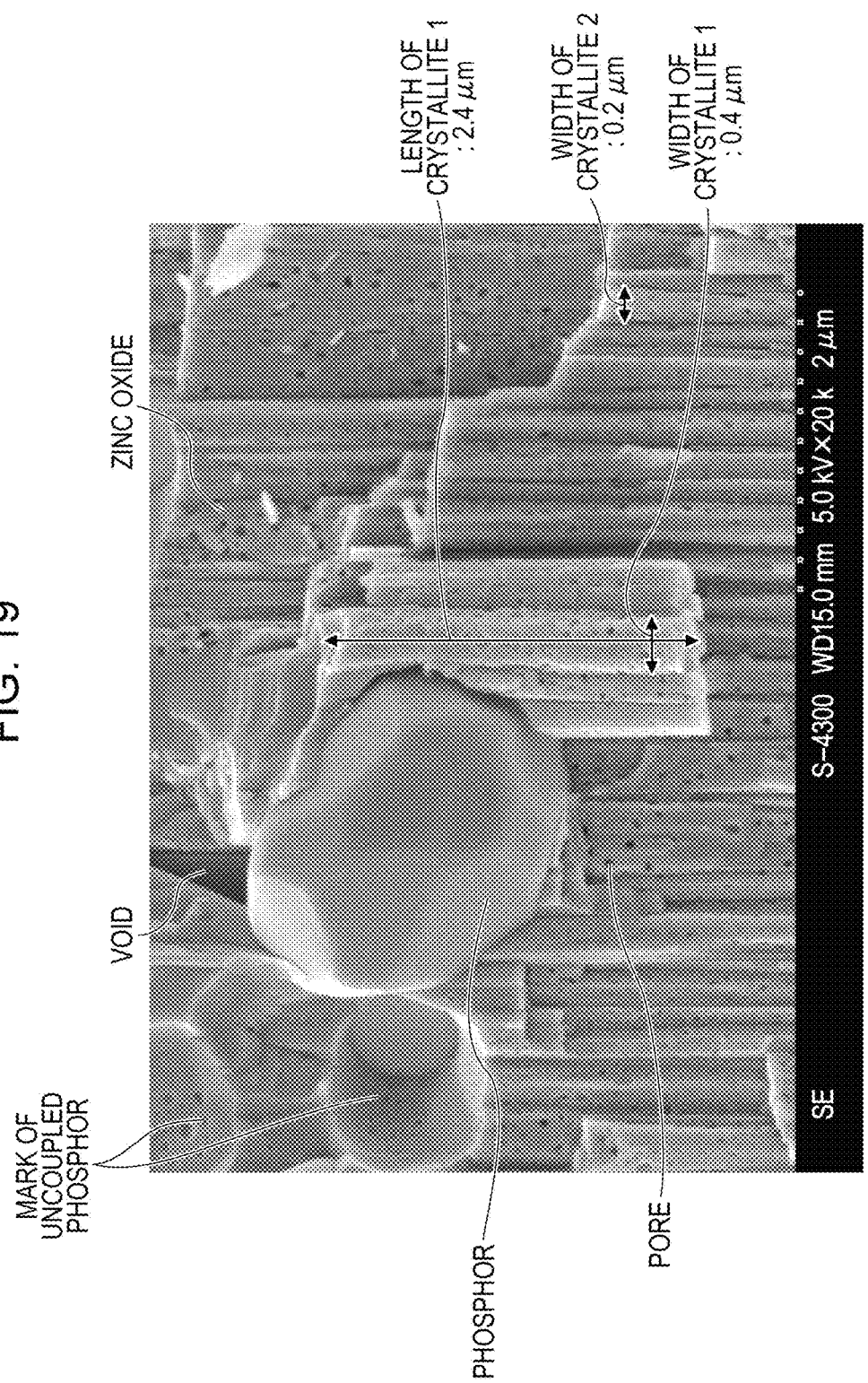
FIG. 19 is an SEM observation image of the surface breaking the phosphor layer of the wavelength converter of Example 1.
Figure 20:
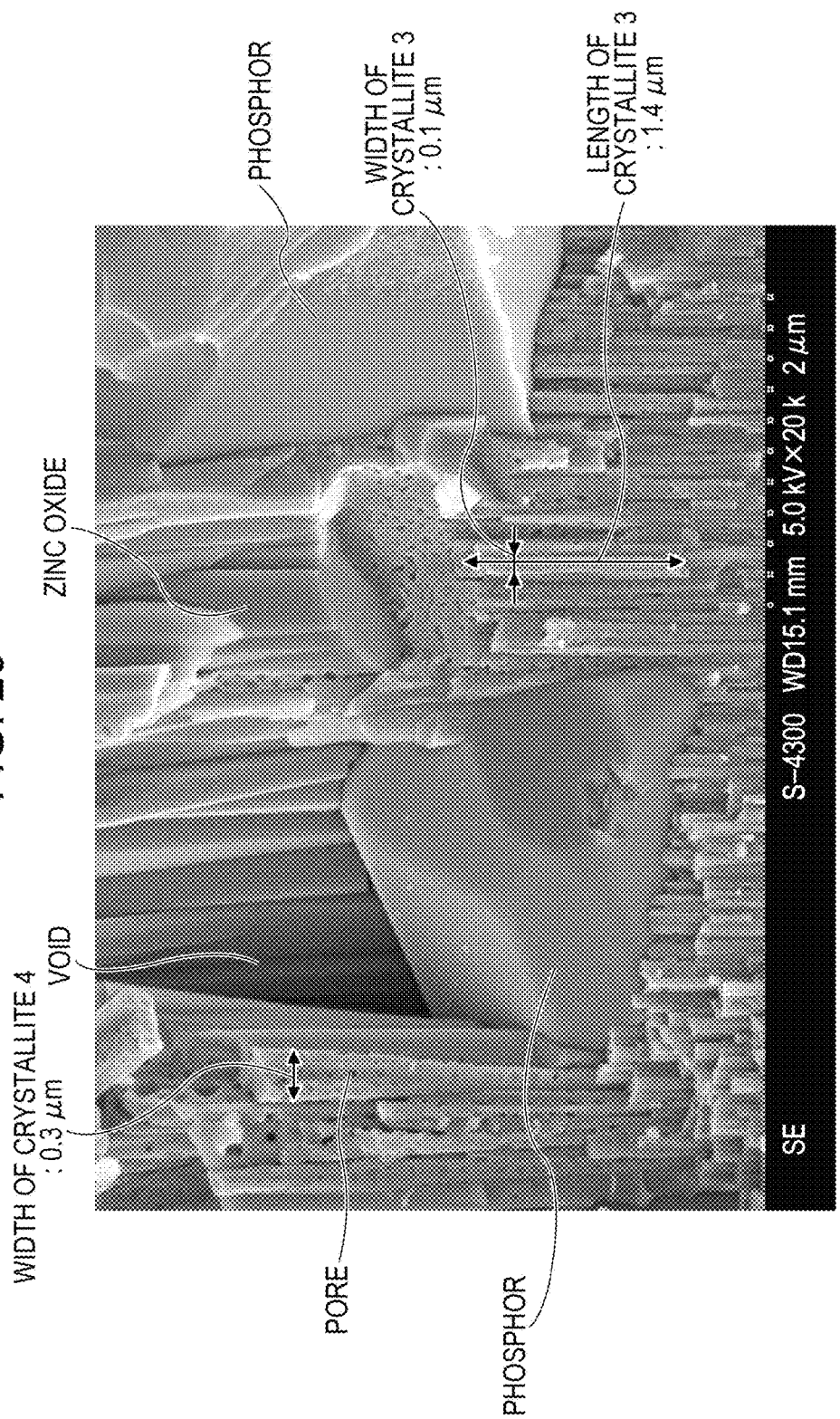
FIG. 20 is an SEM observation image of the surface breaking the phosphor layer of the wavelength converter of Example 3.

FIG. 19 is an SEM observation image of a fractured surface of the phosphor layer of the wavelength converter of Example 1. The zinc oxide crystallites were columnar crystals, the crystallite 1 had a width of 0.4 µm and a length of 2.4 µm. The zinc oxide crystallite 2 had a width of 0.2 µm. FIG. 20 is an enlarged SEM observation image of a fractured surface of the phosphor layer of the wavelength converter of Example 3. The zinc oxide crystallite 3 had a width of 0.1 µm and a length of 1.4 µm. The zinc oxide crystallite 4 had a width of 0.3 µm. As shown in FIGS. 19 and 20, it was confirmed that although the crystallites of zinc oxide had various widths and lengths, crystallites having a width of 0.1 to 0.4 µm and crystallites having a length of 1.4 to 2.4 µm were observed. Thus, whether (1) a zinc oxide crystallite is a columnar crystal or not, (2) pores are formed inside the columnar crystal or not, and (3) the crystal directions of the columnar crystals are the same as one another or not can be judged from the shape of zinc oxide of the matrix in a fractured surface of the phosphor layer. FIGS. 19 and 20 demonstrated that the zinc oxide constituting the matrix was columnar crystals and that the crystal directions of the columnar crystals were the same as one another. It was also confirmed that pores were formed not only on the surface of a columnar crystal, but also inside the columnar crystal. The bases of the observation images of FIGS. 19 and 20 are each parallel to the substrate provided with the phosphor layer. It was accordingly confirmed that the crystal directions of the columnar crystals are in the direction perpendicular to the substrate and are oriented in the c-axis.

Figure 21:
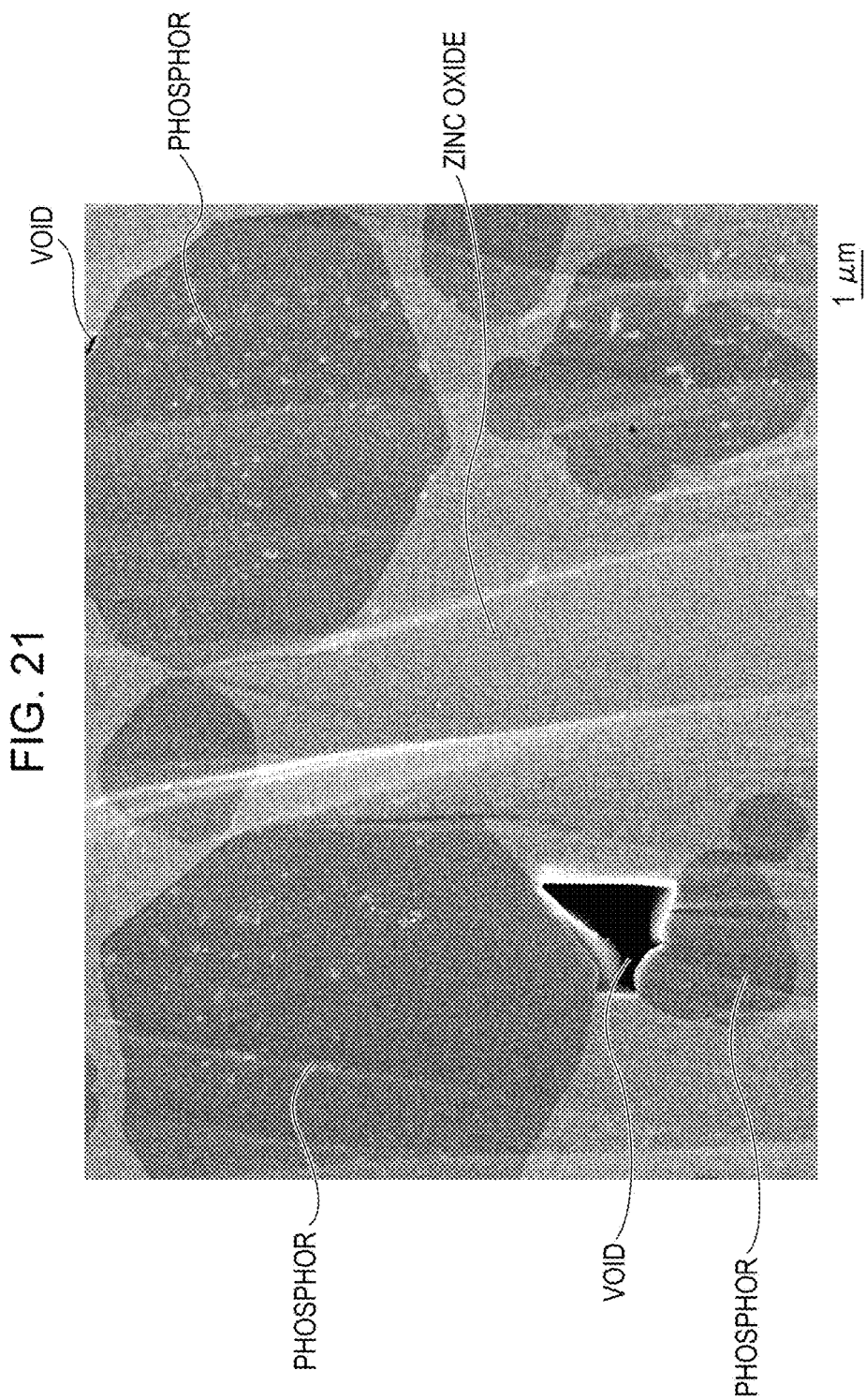
FIG. 21 is a cross-sectional SEM observation image of the wavelength converter of Comparative Example 4.

FIG. 21 shows a cross-sectional SEM observation image of the phosphor layer of the wavelength converter of Comparative Example 4 in which pore treatment of the zinc oxide matrix was performed at 225° C. No pores were observed in the zinc oxide matrix. It was confirmed that heat treatment of zinc oxide between phosphor particles at 225° C. did not form pores.

TABLE 1

|  | Matrix of phosphor layer | Pore-forming treatment | Thickness of phosphor layer (µm) | Temp. of phosphor layer (° C.) | Color temp. (K) | Luminous efficiency | Judgement |
|---|---|---|---|---|---|---|---|
| Comparative Example 1 | Zinc oxide | — | 32 | 177 | 5889 | 115 | — |
| Example 1 | Zinc oxide having pores | Heat treatment 1 (450° C.) | 32 | 166 | 4979 | 119 | Excellent |
| Reference Example 1 | Silicone | — | 39 | 227 | 5726 | defined as 100 | — |

Each luminous efficiency shown in Table 1 is that of a light source when the luminous efficiency of the light source of Reference Example 1 is defined as 100. The results were judged as follows: A case having a luminous efficiency higher than that of Comparative Example 1, in which pore-forming treatment was not performed, was judged to be excellent, and a case having a luminous efficiency lower than that of Comparative Example 1 was judged to be poor. In Example 1, although the phosphor particles and the thickness of the phosphor layer were the same as those in Comparative Example 1, the phosphor temperature was decreased from 177° C. to 166° C., and the color temperature was decreased from 5889K to 4979K. This shows that the pores formed in the zinc oxide matrix by heat treatment at 450° C. improve the heat conductivity of the phosphor layer and also increase the light scattering. This is presumed to be caused by that the impurities contained were removed during the formation of the zinc oxide matrix. The decrease in the temperature of the phosphor layer improved the luminous efficiency of the light source from 115 to 119.

TABLE 2

| | Matrix of phosphor layer | Pore-forming treatment | Thickness of phosphor layer (μm) | Temp. of phosphor layer (° C.) | Color temp. (K) | Luminous efficiency | Judgement |
|---|---|---|---|---|---|---|---|
| Comparative Example 2 | Zinc oxide | — | 33 | 171 | 5493 | 116 | — |
| Example 2 | Zinc oxide having pores | Heat treatment 2 (500° C.) | 33 | 147 | 4349 | 124 | Excellent |
| Reference Example 1 | Silicone | — | 39 | 227 | 5726 | defined as 100 | — |

Each luminous efficiency shown in Table 2 is that of a light source when the luminous efficiency of the light source of Reference Example 1 is defined as 100. The results were judged as follows: A case having a luminous efficiency higher than that of Comparative Example 2, in which pore-forming treatment was not performed, was judged to be excellent, and a case having a luminous efficiency lower than that of Comparative Example 2 was judged to be poor. In Example 2, although the phosphor particles and the thickness of the phosphor layer were the same as those in Comparative Example 2, the phosphor temperature was decreased from 171° C. to 147° C., and the color temperature was decreased from 5493K to 4349K. This shows that the pores formed in the zinc oxide matrix by heat treatment at 500° C. improve the heat conductivity of the phosphor layer and also increase the light scattering. This is presumed to be caused by that the impurities contained were removed during the formation of the zinc oxide matrix. The decrease in the temperature of the phosphor layer improved the luminous efficiency of the light source from 116 to 124.

TABLE 3

| | Matrix of phosphor layer | Pore-forming treatment | Thickness of phosphor layer (μm) | Temp. of phosphor layer (° C.) | Color temp. (K) | Luminous efficiency | Judgement |
|---|---|---|---|---|---|---|---|
| Comparative Example 3 | Zinc oxide | — | 28 | 156 | 8356 | 102 | — |
| Comparative Example 4 | Zinc oxide (no pores) | Heat treatment 3 (225° C.) | 28 | 154 | 8344 | 100 | Poor |
| Example 3 | Zinc oxide having pores | Heat treatment 2 (500° C.) | 28 | 137 | 5617 | 127 | Excellent |
| Reference Example 1 | Silicone | — | 39 | 227 | 5726 | defined as 100 | — |

Each luminous efficiency shown in Table 3 is that of a light source when the luminous efficiency of the light source of Reference Example 1 is defined as 100. The results were judged as follows: A case having a luminous efficiency higher than that of Comparative Example 3, in which pore-forming treatment was not performed, was judged to be excellent, and a case having a luminous efficiency lower than that of Comparative Example 3 was judged to be poor. In Example 3, although the phosphor particles and the thickness of the phosphor layer were the same as those in Comparative Example 3, the phosphor temperature was decreased from 156° C. to 137° C., and the color temperature was decreased from 8356K to 5617K. This shows that the pores formed in the zinc oxide matrix by heat treatment at 500° C. improve the heat conductivity of the phosphor layer and also increase the light scattering. This is presumed to be caused by that the impurities contained were removed during the formation of the zinc oxide matrix. The decrease in the temperature of the phosphor layer improved the luminous efficiency of the light source from 102 to 127.

In contrast, in Comparative Example 4 performed pore-forming treatment by heat treatment at 225° C., although the phosphor particles and the thickness of the phosphor layer were the same as those in Comparative Example 3, in which pore-forming treatment was not performed, the luminous efficiency was decreased from 102 to 100. This is presumed to be caused by that impurities contained were not sufficiently removed during the formation of the zinc oxide matrix, because the phosphor temperature was changed from 156° C. to 154° C., which was substantially no change; the color temperature was changed from 8356K to 8344K, which was substantially no change; and as described above, pores were not formed in the zinc oxide matrix in Comparative Example 4.

When the temperature of the pore-forming treatment was 225° C., pores were not formed in the zinc oxide matrix between the phosphor particles. Pores were formed in the zinc oxide matrix at a temperature of 450° C. to 500° C. In the formation at 450° C., the pores that could be observed had a diameter in a range of 10 to 170 nm. In the formation at 500° C., the pores that could be observed had a diameter in a range of 10 to 200 nm. The pores having a diameter in a range of 10 to 170 nm have a high effect of decreasing the temperature of the phosphor layer to improve the luminous efficiency. The pores having a diameter in a range of 10 to 200 nm have a further higher effect of decreasing the temperature of the phosphor layer to further improve the luminous efficiency.

In the zinc oxide film not containing phosphor particles, cracks occurred in a temperature of 450° C. to 500° C., but no cracks occurred in the zinc oxide matrix between phosphor particles even in a temperature of 450° C. to 500° C. This is presumed that in the impurities gasified and discharged to the outside during the formation of zinc oxide, the path for the discharge and the amount of the impurities vary depending on the shape of the zinc oxide. Accordingly, a zinc oxide film cannot be heated at a temperature of 450° C. or more due to occurrence of cracks. A zinc oxide matrix between phosphor particles, however, can be subjected to pore-forming treatment at a high temperature of 450° C. or more. Consequently, a larger amount of impurities contained are removed during the formation of the zinc oxide matrix, the heat conducted between crystal lattices of the zinc oxide matrix is prevented from scattering, and the temperature of the phosphor layer can be decreased, leading to an improvement in luminous efficiency. The upper limit of the temperature of heating the phosphor layer is restricted by the temperature of a member having the lowest heat resistance in the wavelength converter. In this embodiment, the dichromic mirror made of a dielectric multilayer film formed on the substrate is the member having the lowest heat resistance, and the heat resistant temperature of the dichromic mirror was 1000° C.

Furthermore, during the formation of the zinc oxide matrix, the impurities contained are removed, and at the same time pores are formed in the matrix to improve the light scattering performance of the phosphor layer. Accordingly, even though the same phosphor particles are used, as shown in Example 3, the thickness of the phosphor layer for achieving a white light source can be reduced compared to Comparative Examples 1 and 2. As a result, the temperature of the phosphor layer can be further reduced, and the luminous efficiency can be further improved.

Figure 22:
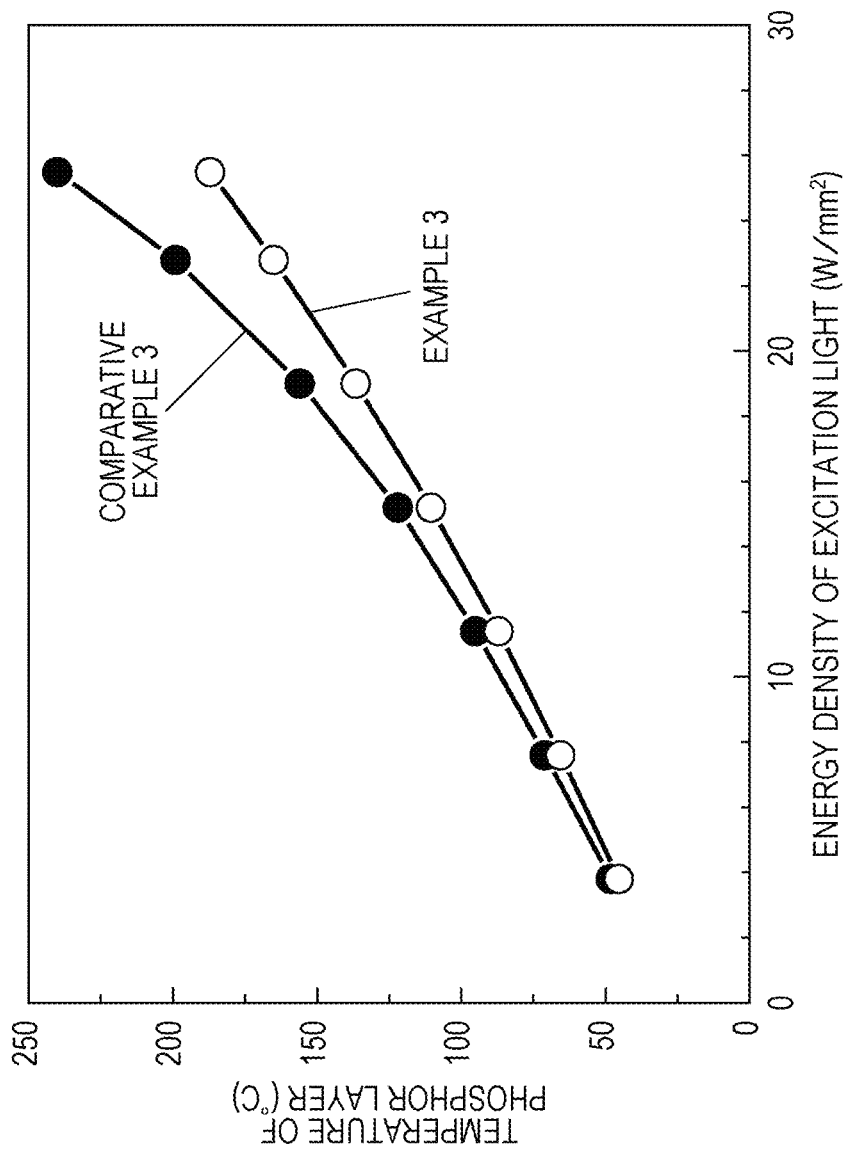
FIG. 22 is a graph showing dependency of the temperature of a phosphor layer on the energy density of excitation light, in the light sources of Example 3 and Comparative Example 3.

FIG. 22 shows the results of evaluation of the light sources of Example 3 and Comparative Example 3 for the temperature of the phosphor layer by changing the energy density of excitation light input in the wavelength converter. It was confirmed that excitation light having a higher energy density had a larger difference between Example 3 and Comparative Example 3 in the effect of reducing the temperature of the phosphor layer. The results demonstrated that the effect of reducing the temperature of a phosphor layer was shown when the excitation light energy density was 11.4 W/mm$^2$ or more; a further higher effect of reducing the temperature of a phosphor layer was shown when the excitation light energy density was 15.2 W/mm$^2$ or more; a further higher effect of reducing the temperature of a phosphor layer was shown when the excitation light energy density was 19.0 W/mm$^2$ or more; a further higher effect of reducing the temperature of a phosphor layer was shown when the excitation light energy density was 22.8 W/mm$^2$ or more; and the highest effect of reducing the temperature of a phosphor layer was shown when the excitation light energy density was 25.5 W/mm$^2$ or more.

The wavelength converter of the present disclosure and the light source including the wavelength converter can be used as a wavelength converter and a light source, respectively, in, for example, an ordinary lighting system, such as a ceiling light; a special lighting system, such as a spotlight, a light for stadium, or a light for studio; a lighting system for a vehicle, such as a head lamp; a projector or head up display projector; a light for an endoscope; an imaging apparatus, such as a digital camera, a mobile phone, or a smartphone; or a liquid crystal display of, for example, a monitor for a personal computer (PC), a notebook personal computer, a television, a personal digital assistant (PDA), a smartphone, a tablet PC, or a mobile phone.

What is claimed is:

1. A wavelength converter comprising:
   phosphor particles; and
   a matrix that is located between the phosphor particles and comprises zinc oxide crystallites, wherein:
   pores are included in at least one of the zinc oxide crystallites, and
   the pores in at least one of the zinc oxide crystallites are disposed non-uniformly.

2. The wavelength converter according to claim 1, wherein the zinc oxide crystallites are columnar crystals.

3. The wavelength converter according to claim 1, wherein at least one of the pores has a diameter of 10 nm or more and 200 nm or less.

4. The wavelength converter according to claim 1, wherein a cross section of the at least one of the zinc oxide crystallites includes first regions having pore ratios higher than remaining regions, where a pore ratio of a region is a ratio of an area occupied by pores to a whole area of the region.

5. The wavelength converter according to claim 4, wherein a pore ratio of at least one of the first regions is equal to or more than 2% and equal to or less than 6%.

6. The wavelength converter according to claim 1, further comprising a substrate, wherein:
the phosphor particles and the matrix constitute a phosphor layer, and
the substrate has a thickness larger than a thickness of the phosphor layer.

7. The wavelength converter according to claim 6, wherein the zinc oxide crystallites are oriented in a c-axis.

8. A light source comprising:
a semiconductor light emitting device that emits light having a peak wavelength of 420 nm or more and 470 nm or less; and
a wavelength converter that receives the light emitted from the semiconductor light emitting device and emits converted light having a wavelength different from a wavelength of the light, wherein:
the wavelength converter comprises:
phosphor particles; and
a matrix that is located between the phosphor particles and comprises zinc oxide crystallites, wherein pores are included in at least one of the zinc oxide crystallites, and the pores in at least one of the zinc oxide crystallites are disposed non-uniformly.

9. The light source according to claim 8, wherein the light emitted from the semiconductor light emitting device has an energy density of at least 11.4 $W/mm^2$.

10. A lighting system comprising:
a light source; and
a power supply source coupled to the light source, wherein the light source comprises:
a semiconductor light emitting device that emits light having a peak wavelength of 420 nm or more and 470 nm or less; and
a wavelength converter that receives the light emitted from the semiconductor light emitting device and emits converted light having a wavelength different from a wavelength of the light, wherein
the wavelength converter comprises:
phosphor particles; and
a matrix that is located between the phosphor particles and comprises zinc oxide crystallites, wherein pores are included in at least one of the zinc oxide crystallites, the pores in at least one of the zinc oxide crystallites are disposed non-uniformly.

11. The lighting system according to claim 10, being for a vehicle.

12. A vehicle comprising: the lighting system for a vehicle according to claim 10; and a generator coupled to the power supply source.

* * * * *